(12) United States Patent
Chang et al.

(10) Patent No.: US 12,301,186 B2
(45) Date of Patent: May 13, 2025

(54) DIFFERENTIAL AMPLIFIER

(71) Applicant: Taiwan Semiconductor Manufacturing Company, Ltd., Hsinchu (TW)

(72) Inventors: Chin-Hao Chang, Hsinchu (TW); Manoj M. Mhala, Hsinchu (TW); Calvin Yi-Ping Chao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 252 days.

(21) Appl. No.: 17/853,913

(22) Filed: Jun. 29, 2022

(65) Prior Publication Data

US 2022/0337206 A1 Oct. 20, 2022

Related U.S. Application Data

(62) Division of application No. 16/836,924, filed on Apr. 1, 2020, now Pat. No. 11,424,726.

(51) Int. Cl.
*H03F 3/45* (2006.01)
*H03F 3/72* (2006.01)

(52) U.S. Cl.
CPC ..... *H03F 3/45183* (2013.01); *H03F 3/45085* (2013.01); *H03F 3/45475* (2013.01); *H03F 3/72* (2013.01)

(58) Field of Classification Search
CPC .... H03F 3/45183; H03F 3/45085; H03F 1/26; H03F 1/526; H03F 2203/7236; H03F 3/72; H03F 3/45188; H03F 3/45179; H03F 3/45192; H03F 3/45475; H03F 1/303; H03F 3/005
USPC .................................................. 330/51, 253
See application file for complete search history.

(56) References Cited

U.S. PATENT DOCUMENTS

| | | | | |
|---|---|---|---|---|
| 7,733,156 B2* | 6/2010 | Brederlow | ............... | H03F 1/26 327/389 |
| 8,120,423 B2* | 2/2012 | Deng | ..................... | H03F 3/005 330/147 |
| 9,666,143 B2* | 5/2017 | Ichikura | ............... | H03F 1/0205 |
| 2010/0182301 A1* | 7/2010 | Yasuda | ............... | H03F 3/45179 330/257 |

* cited by examiner

*Primary Examiner* — Khanh V Nguyen
(74) *Attorney, Agent, or Firm* — JCIPRNET

(57) ABSTRACT

A differential amplifier is provided. The differential amplifier includes a first load, a second load, a current source, a differential pair circuit, a first and a second switch circuit. The differential pair circuit includes a first transistor, a second transistor, a third transistor, and a fourth transistor. The first switch circuit controls the first and the second transistors, and the second switch circuit controls the third and the fourth transistors. Through the control and selection of the first and second switch circuits, a differential pair is selected in the differential pair circuit to receive and process a first input signal and a second input signal for signal.

20 Claims, 14 Drawing Sheets

DIFFERENTIAL AMPLIFIER

CROSS-REFERENCE TO RELATED APPLICATION

This application is a divisional application of and claims the priority benefit of a prior application Ser. No. 16/836,924, filed on Apr. 1, 2020. The entirety of each of the above-mentioned patent applications is hereby incorporated by reference herein and made a part of this specification.

BACKGROUND

Signal integrity is now one of the most critical indexes when it to evaluating the interface circuit. Specifically, different approaches and methods have been developed to improve the noise produced by the interface circuit. However, current methods tend to seek software or algorithm solutions for suppressing noise or eliminating noise generated by the circuit. The conventional solutions usually collect statistical data from the circuit to correct data through data interpolation, which requires continuous operation in the background and thus induces increased data latency of the circuit. Therefore, additional computation area and power are required by the conventional solutions to continuously correct noise in the background.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1A:
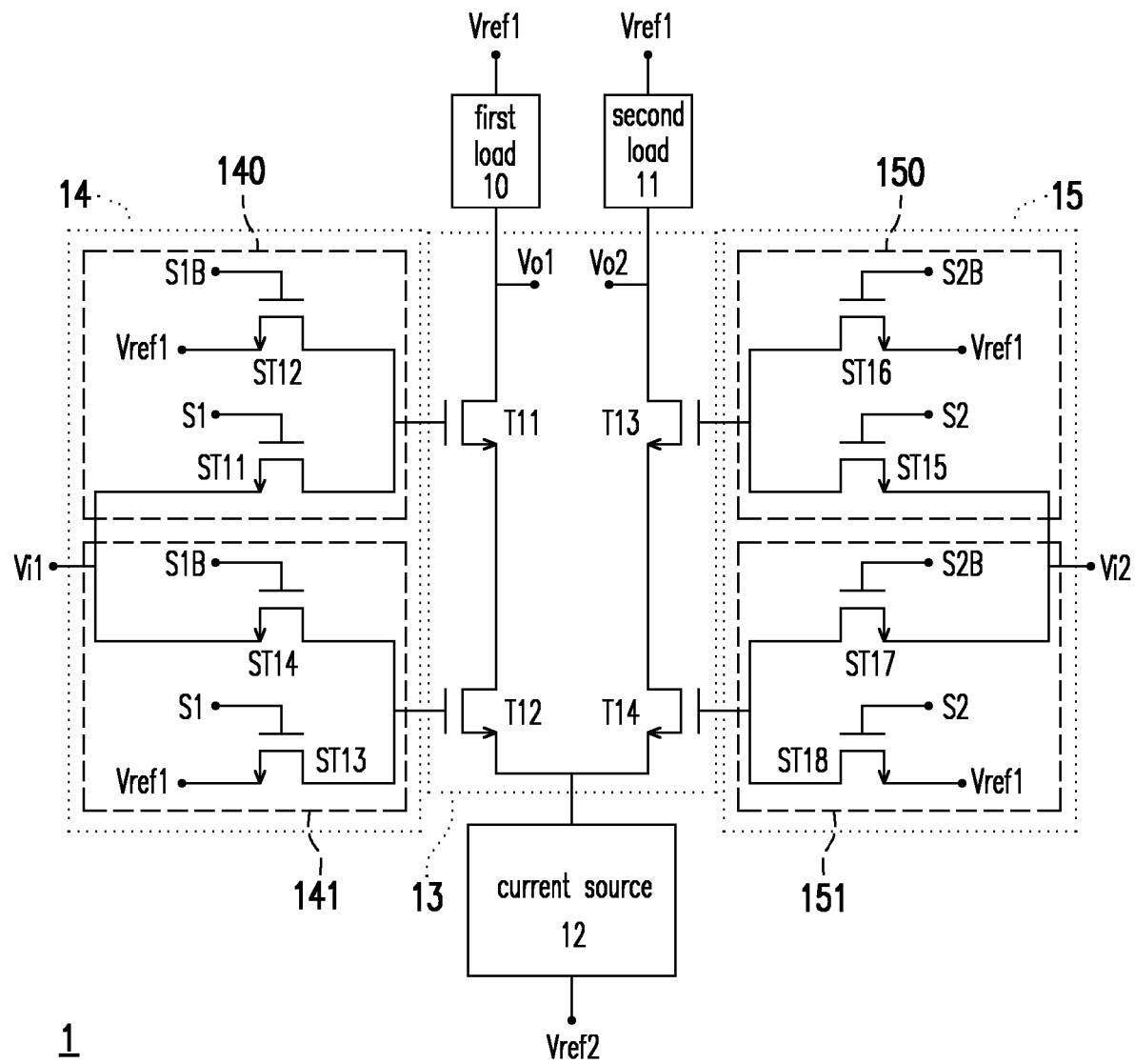
FIG. 1A is a schematic diagram illustrating a differential amplifier in accordance with some embodiments.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring to FIG. 1A, which is a schematic diagram illustrating a differential amplifier 1 in accordance with some embodiments. The differential amplifier 1 includes a first load 10, a second load 11, a current source 12, a differential pair circuit 13, a first switch circuit 14, a second switch circuit 15. A first reference voltage Vref1 is provided to the first load 10 and the second load 11. A second reference voltage Vref2 is provided to the current source 12. A first input signal Vi1 is provided to the first switch circuit 14 and a second input signal Vi2 is provided to the second switch circuit 15. Specifically, the differential pair circuit 13 includes a first transistors T11, a second transistor T12, a third transistor T13, and a fourth transistor T14. The extra transistors T11-T14 in the differential pair circuit 13 enables the differential amplifier 1 to select two certain transistors from the transistors T11-T14 for processing the first and the second input signals Vi1 and Vi2 and further preventing the noise (e.g. random telegraph noise, RTN) issue. The first switch circuit 14 is controlled by a first control signal S1 and the second switch circuit 15 is controlled by a second control signal S2. According to the control of the first control signal S1, the first input signal Vi1 is selectively provided to the first transistor T11 or the second transistor T12. According to the control of the second control signal S2, the second input signal Vi2 is selectively provided to the third transistor T13 or the fourth transistor T14. Therefore, the differential amplifier 1 may choose one transistor from the first transistor T11 and the second transistor T12, and choose one transistor from the third transistor T13 and the fourth transistor T14 according to the first control signal S1 and the second control signal S2. A differential input pair may be formed by the two chosen transistors for performing amplifying operation to the first input signal and the second input signal, and thus a first output signal Vo1 and a second output signal Vo2 are generated.

In brief, redundant or backup semiconductor components are disposed in the differential amplifier, so it takes only one scan by the differential amplifier 1 before initiation or power on to detect and identify which component inside is defect or attributed to the noise, and the differential amplifier 1 may be switched and controlled to use other components for signal processing to prevent noise issue. Therefore, the consumed power and data latency of the differential amplifier 1 is reduced through operation in the foreground.

Specifically, the first transistor T11 has a first terminal (e.g. drain terminal), a second terminal (e.g. source terminal) and a control terminal (e.g. gate terminal). The second transistor T12 has a first terminal (e.g. drain terminal), a second terminal (e.g. source terminal) and a control terminal (e.g. gate terminal). The first terminal of the first transistor T11 is coupled to the first load 10. The second terminal of the first transistor T11 is coupled to the first terminal of the second transistor T12. The second terminal of the second transistor T12 is coupled to the current source 12. The control terminal of the first transistor T11 and the control terminal of the second transistor T12 are coupled to the first switch circuit 14. The first transistor T11 and the second transistor T12 are serially connected between the first load 10 and the current source 12.

The third transistor T13 has a first terminal (e.g. drain terminal), a second terminal (e.g. source terminal) and a control terminal (e.g. gate terminal). The fourth transistor T14 has a first terminal (e.g. drain terminal), a second terminal (e.g. source terminal) and a control terminal (e.g. gate terminal). The first terminal of the third transistor T13 is coupled to the second load 11. The second terminal of the third transistor T13 is coupled to the first terminal of the fourth transistor T14. The second terminal of the fourth transistor T14 is coupled to the current source 12. The control terminal of the third transistor T13 and the control terminal of the fourth transistor T14 are coupled to the second switch circuit 15. The third transistor T13 and the fourth transistor T14 are serially connected between the second load 11 and the current source 12.

The first transistor T11 may be, for example but not limited to, a metal-oxide-semiconductor field-effect transistor (MOSFET), a bipolar junction transistor (BJT) or the like. The second transistor T12 may be, for example but not limited to, a metal-oxide-semiconductor field-effect transistor (MOSFET), a bipolar junction transistor (BJT) or the like. The third transistor T13 may be, for example but not limited to, a metal-oxide-semiconductor field-effect transistor (MOSFET), a bipolar junction transistor (BJT) or the like. The fourth transistor T14 may be, for example but not limited to, a metal-oxide-semiconductor field-effect transistor (MOSFET), a bipolar junction transistor (BJT) or the like.

The first load 10 may include passive components (e.g. resistors, capacitors, inductors or the like), active components (e.g. transistors) or the combination thereof. The second load 11 may include passive components (e.g. resistors, capacitors, inductors or the like), active components (e.g. transistors) or the combination thereof. In one embodiment, the first load 10 and the second load 11 are integrated as one load circuit connected to the first transistor T11 and the third transistor T13. For example, the integrated load may be a cross-coupled pair connected to the first transistor T11 and the third transistor T13.

The first switch circuit 14 is controlled by the first control signal S1 and an inverted first control signal S1B to determine whether to provide the first input signal Vi1 to the first transistor T11 or the second transistor T12. The inverted first control signal S1B is generated by inverting the sign of the first control signal S1 through an inverter (not illustrated in FIG. 1A). When the first switch circuit 14 provides the first input signal Vi1 to the control terminal of one of the first transistor T11 and the second transistor T12, the first switch circuit 14 provides the first reference voltage Vref1 to the control terminal of another one of the first transistor T11 and the second transistor T12.

Specifically, the first switch circuit 14 includes a first switch 140 and a second switch 141. The first switch 140 is coupled to the control terminal of the first transistor T11. The second switch 141 is coupled to the control terminal of the first transistor T12. The first switch 140 and the second switch 141 are controlled by the first control signal S1 and the inverted first control signal S1B. When the first switch 140 provides one of the first input signal Vi1 and the first reference voltage Vref1 to the control terminal of the first transistor T11, the second switch 141 provides another one of the first input signal S1 and the first reference voltage Vref1 to the control terminal of the second transistor T12.

The first switch 140 includes a first switch transistor ST11 and a second switch transistor ST12. The first switch transistor ST11 has a first terminal (e.g. drain terminal), a second terminal (e.g. source terminal) and a control terminal (e.g. gate terminal). The second switch transistor ST12 has a first terminal (e.g. drain terminal), a second terminal (e.g. source terminal) and a control terminal (e.g. gate terminal). The first terminal of the first switch transistor ST11 is coupled to the control end of the first transistor T11. The second terminal of the first switch transistor ST11 is coupled to receive the first input signal Vi1. The control terminal of the first switch transistor ST11 is coupled to receive the first control signal S1. The first terminal of the second switch transistor ST12 is coupled to the control end of the first transistor T11. The second terminal of the second switch transistor ST12 is coupled to receive the first reference voltage Vref1. The control terminal of the second switch transistor ST12 is coupled to receive the inverted first control signal S1B.

The second switch 141 includes a third switch transistor ST13 and a fourth switch transistor ST14. The third switch transistor ST13 has a first terminal (e.g. drain terminal), a second terminal (e.g. source terminal) and a control terminal (e.g. gate terminal). The fourth switch transistor ST14 has a first terminal (e.g. drain terminal), a second terminal (e.g. source terminal) and a control terminal (e.g. gate terminal). The first terminal of the third switch transistor ST13 is coupled to the control end of the second transistor T12. The second terminal of the third switch transistor ST13 is coupled to receive the first reference voltage Vref1. The control terminal of the third switch transistor ST13 is coupled to receive the first control signal S1. The first terminal of the fourth switch transistor ST14 is coupled to the control end of the second transistor T12. The second terminal of the fourth switch transistor ST14 is coupled to receive the first input signal Vi1. The control terminal of the fourth switch transistor ST14 is coupled to receive the inverted first control signal S1B.

The second switch circuit 15 is controlled by the second control signal S2 and an inverted second control signal S2B to determine whether to provide the second input signal Vi2 to the third transistor T13 or the fourth transistor T14. The inverted second control signal S2B is generated by inverting the sign of the second control signal S2 through an inverter (not illustrated in FIG. 1A). When the second switch circuit 15 provides the second input signal Vi2 to the control terminal of one of the third transistor T13 and the fourth transistor T14, the second switch circuit 15 provides the first reference voltage Vref1 to the control terminal of another one of the third transistor T13 and the fourth transistor T14.

Specifically, the second switch circuit 15 includes a third switch 150 and a fourth switch 151. The third switch 150 is coupled to the control terminal of the third transistor T13. The fourth switch 151 is coupled to the control terminal of the first transistor T12. The third switch 150 and the fourth switch 151 are controlled by the second control signal S2 and the inverted second control signal S2B. When the third switch 150 provides one of the second input signal Vi2 and the first reference voltage Vref1 to the control terminal of the third transistor T13, the fourth switch 151 provides another one of the first input signal S1 and the first reference voltage Vref1 to the control terminal of the fourth transistor T14.

The third switch 150 includes a fifth switch transistor ST15 and a sixth switch transistor ST16. The fifth switch transistor ST15 has a first terminal (e.g. drain terminal), a second terminal (e.g. source terminal) and a control terminal (e.g. gate terminal). The sixth switch transistor ST16 has a first terminal (e.g. drain terminal), a second terminal (e.g. source terminal) and a control terminal (e.g. gate terminal). The first terminal of the fifth switch transistor ST15 is coupled to the control end of the third transistor T13. The second terminal of the fifth switch transistor ST15 is coupled to receive the second input signal Vi2. The control terminal of the fifth switch transistor ST15 is coupled to receive the second control signal S2. The first terminal of the sixth switch transistor ST16 is coupled to the control end of the third transistor T13. The second terminal of the sixth switch transistor ST16 is coupled to receive the first reference voltage Vref1. The control terminal of the sixth switch transistor ST16 is coupled to receive the inverted second control signal S2B.

The fourth switch 151 includes a seventh switch transistor ST17 and an eighth switch transistor ST18. The seventh switch transistor ST17 has a first terminal (e.g. drain terminal), a second terminal (e.g. source terminal) and a control terminal (e.g. gate terminal). The eighth switch transistor ST18 has a first terminal (e.g. drain terminal), a second terminal (e.g. source terminal) and a control terminal (e.g. gate terminal). The first terminal of the seventh switch transistor ST17 is coupled to the control end of the fourth transistor T14. The second terminal of the seventh switch transistor ST17 is coupled to receive the first reference voltage Vref1. The control terminal of the seventh switch transistor ST17 is coupled to receive the second control signal S2. The first terminal of the eighth switch transistor ST18 is coupled to the control end of the fourth transistor T14. The second terminal of the eighth switch transistor ST18 is coupled to receive the second input signal Vi2. The control terminal of the eighth switch transistor ST18 is coupled to receive the inverted second control signal S2B.

For example, if the first transistor T11 is determined to cause random telegraph noise (RTN) during processing the first input signal Vi1, another second transistor T12 may be selected to receive and process the first input signal Vi1 without deteriorating the first output signal Vo1. In addition, since the first transistor T11 and the second transistor T12 are serially connected, the first reference voltage Vref1 is provided to the unselected first transistor T11 to keep the first transistor T11 conducted. Similarly, one of the third transistor T13 and the fourth transistor T14 may be selected to provide the second input signal Vi2, and the another one may be provided with the first reference voltage Vref1. A differential input pair can be formed by selecting one transistor from the first and the second transistors T11 and T12, and selecting another transistor from the third and the fourth transistor T13 and T14. As a result, the differential amplifier 1 can effectively avoid using the transistors which would cause RTN for signal processing to further improve the signal integrity.

Therefore, through the control of the first control signal S1, the first input signal Vi1 may be provided to one of the first transistor T11 and the second transistor T12 while the first reference voltage Vref1 may be provided to another one of the first transistor T11 and the second transistor T12. Through the control of the second control signal S2, the second input signal Vi2 may be provided to one of the third transistor T13 and the fourth transistor T14 while the first reference voltage Vref1 may be provided to another one of the third transistor T13 and the fourth transistor T14.

Figure 1B:
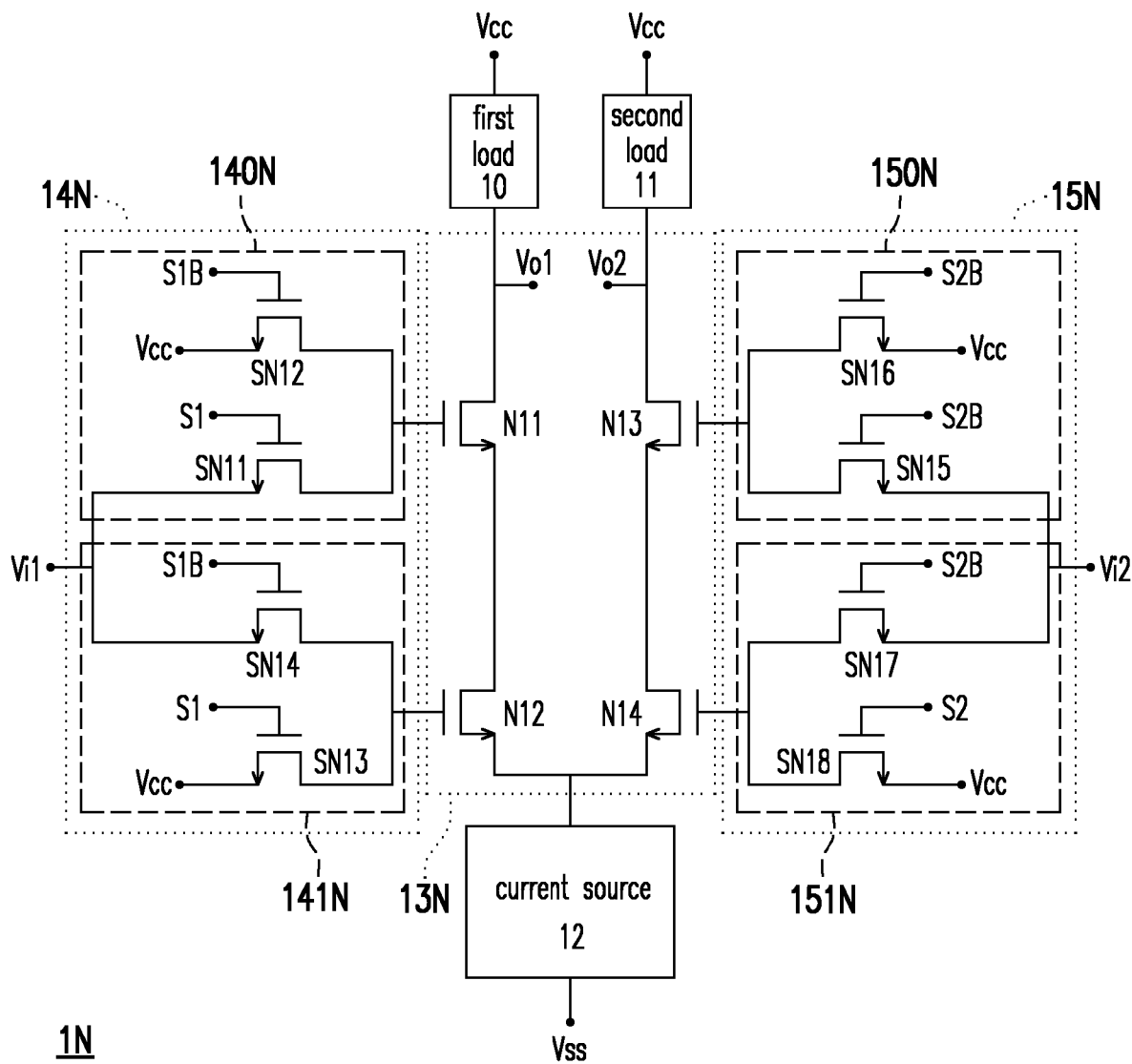
FIG. 1B is a schematic diagram of a differential amplifier in accordance with some embodiments.

Please refer to FIG. 1B, which is a schematic diagram of a differential amplifier 1N in accordance with some embodiments. The differential amplifier 1N includes a first load 10, second load 11, a current source 12, a first switch circuit 14N, a second switch circuit 15N and a first transistor N11, a second transistor N12, a third transistor N13 and a fourth transistor N14. The first switch circuit 14N includes a first switch 140N and a second switch 141N. The second switch circuit 15N includes a third switch 150N and a fourth switch 151N. The first switch 140N includes a first switch transistor SN11 and a second switch transistor SN12. The second switch 141N includes a third switch transistor SN13 and a fourth switch transistor SN14. The third switch 150N includes a fifth switch transistor SN15 and a sixth transistor SN16. The fourth switch 151N includes a seventh switch transistor SN17 and an eighth transistor SN18.

The differential amplifier 1N illustrated in FIG. 1B is similar to the differential amplifier 1 illustrated in FIG. 1A, except that some of the transistors in the differential amplifier 1N are N-type MOSFETs. Specifically, the first transistor N11, the second transistor N12, the third transistor N13, the fourth transistor N14, the first switch transistor SN11, the second switch transistor SN12, the third switch transistor SN13, the fourth switch transistor SN14, the fifth switch transistor SN15, the sixth switch transistor SN16, the seventh switch transistor SN17 and the eighth switch transistor SN18 are N-type MOSFETs. In order to supply the operation of the differential amplifier 1N and to conduct the first to fourth transistors N11-N14, an operation voltage Vcc, which replaces the first reference voltage Vref1 illustrated in FIG. 1A, is provided to the first load 10, the second load 11, the first switch circuit 14N and the second switch circuit 15N, and a ground voltage Vss, which replaces the second reference voltage Vref2 illustrated in FIG. 1A, is provided to the current source 12. In operation, one transistor from the first and the second transistors N11, N12 is selected and another one transistor from the third and the fourth transistors N13, N14 is selected. The first and the second input signals are provided to the selected transistors, and the operation voltage Vcc is provided to those unselected transistors. Please refer to Table I as shown below for the operation of the transistors N11-N14 corresponding to the first and the second control signals S1 and S2. The first control signal S1 corresponds to the operation of the first transistor N11 and the second control signal S2 corresponds to the operation of the third transistor N13. When the first control signal S1 with low voltage (i.e. logic 0) is provided to the first switch circuit 14N, the first transistor N ii receives the operation voltage Vcc and is operated in the linear region. When the first control signal S1 with high voltage (i.e. logic 1) is provided to the first switch circuit 14N, the first transistor N11 receives the first input signal Vi1 and is operated in the saturation region. When the second control signal S2 with low voltage (i.e. logic 0) is provided to the second switch circuit 15N, the third transistor N13 receives the operation voltage Vcc and is operated in the linear region. When the second control signal S2 with high voltage (i.e. logic 1) is provided to the second switch circuit 15N, the third transistor N13 receives the second input signal Vi2 and is operated in the saturation region.

TABLE I

| S1 | S2 | N11 | N12 | N13 | N14 |
|----|----|-----|-----|-----|-----|
| 0 | 0 | Linear | Saturation | Linear | Saturation |
| 0 | 1 | Linear | Saturation | Saturation | Linear |
| 1 | 0 | Saturation | Linear | Linear | Saturation |
| 1 | 1 | Saturation | Linear | Saturation | Linear |

Figure 1C:
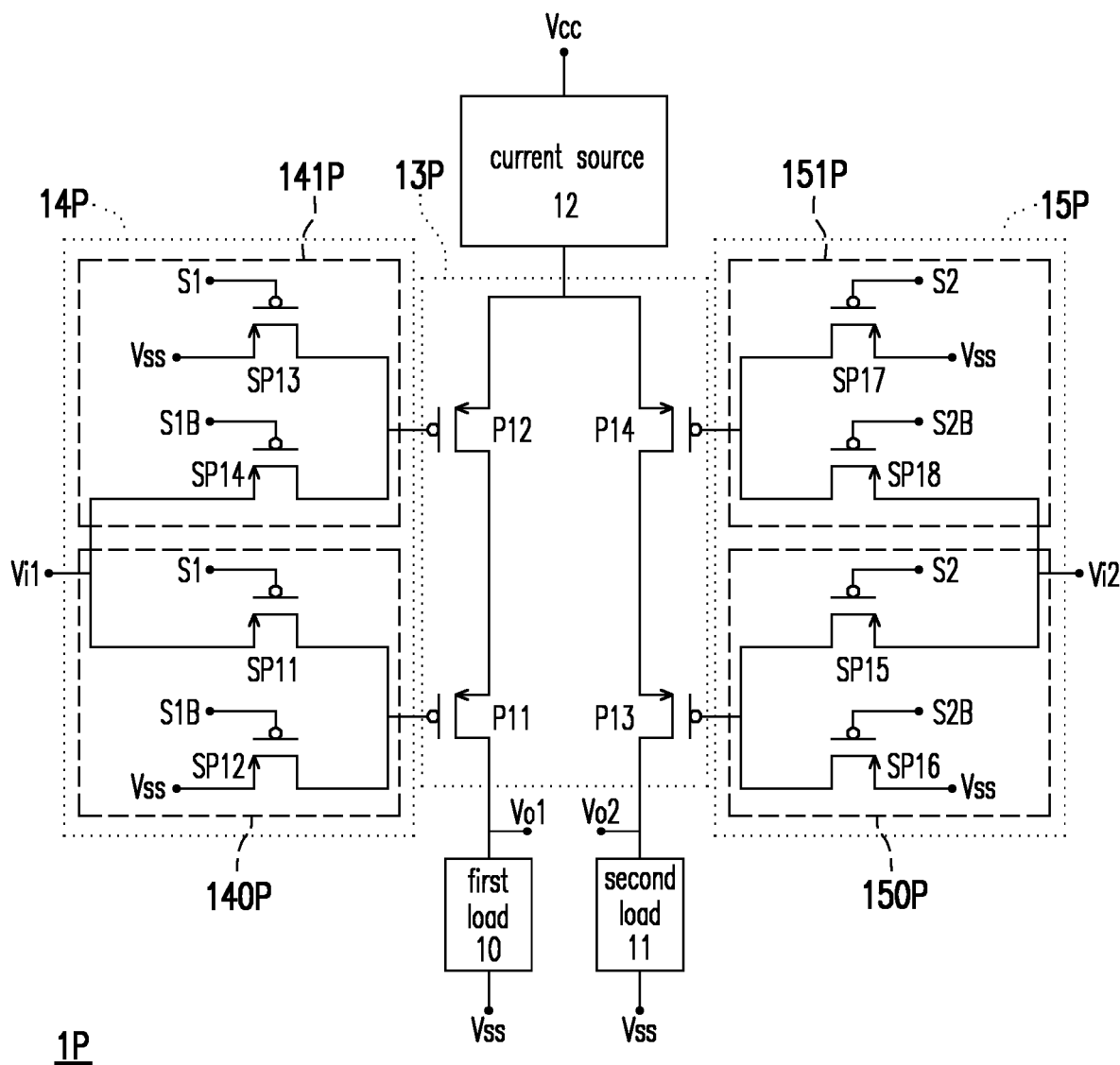
FIG. 1C is a schematic diagram of a differential amplifier in accordance with some embodiments.

Please refer to FIG. 1C, which is a schematic diagram of a differential amplifier 1P in accordance with some embodiments. The differential amplifier 1P includes a first load 10, a second load 11, a current source 12, a first switch circuit 14P, a second switch circuit 15P and a first transistor P11, a second transistor P12, a third transistor P13 and a fourth transistor P14. The first switch circuit 14P includes a first switch 140P and a second switch 141P. The second switch circuit 15P includes a third switch 150P and a fourth switch 151P. The first switch 140P includes a first switch transistor SP11 and a second switch transistor SP12. The second switch 141P includes a third switch transistor SP13 and a fourth switch transistor SP14. The third switch 150P includes a fifth switch transistor SP15 and a sixth transistor SP16. The fourth switch 151P includes a seventh switch transistor SP17 and an eighth transistor SP18.

The differential amplifier 1P illustrated in FIG. 1C is similar to the differential amplifier 1 illustrated in FIG. 1A, except that some of the transistors in the differential amplifier 1P are P-type MOSFETs. Specifically, the first transistor P11, the second transistor P12, the third transistor P13, the fourth transistor P14, the first switch transistor SP11, the second switch transistor SP12, the third switch transistor SP13, the fourth switch transistor SP14, the fifth switch transistor SP15, the sixth switch transistor SP16, the seventh switch transistor SP17 and the eighth switch transistor SP18 are P-type MOSFETs. In order to supply the operation of the differential amplifier 1P and to conduct the first to fourth transistors P11-P14, the ground voltage Vss, which replaces the first reference voltage Vref1 illustrated in FIG. 1A, is provided to the first load 10, the second load 11, the first switch circuit 14P and the second switch circuit 15P, and the operation voltage Vcc, which replaces the second reference voltage Vref2 illustrated in FIG. 1A, is provided to the current source 12. In operation, one transistor from the first and the second transistors P11, P12 is selected and another one transistor from the third and the fourth transistors P13, P14 is selected. The first and the second input signals are provided to the selected transistors, and the ground voltage Vss is provided to those unselected transistors. Please refer to Table II as shown below for the operation of each transistors P11-P14 corresponding to the first and the second control signals S1 and S2. The first control signal S1 corresponds to the operation of the first transistor P11 and the second control signal S2 corresponds to the operation P13. When the first control signal S1 with low voltage (i.e. logic 0) is provided to the first switch circuit 14P, the first transistor P11 receives the first input signal Vi1 and is operated in the saturation region. When the first control signal S1 with high voltage (i.e. logic 1) is provided to the first switch circuit 14P, the first transistor P11 receives the ground voltage Vss and is operated in the linear region. When the second control signal S2 with low voltage (i.e. logic 0) is provided to the second switch circuit 15P, the third transistor P13 receives the second input signal Vi2 and is operated in the saturation region. When the second control signal S2 with high voltage (i.e. logic 1) is provided to the second switch circuit 15P, the third transistor P13 receives the ground voltage Vss and is operated in the linear region.

TABLE II

| S1 | S2 | P11 | P12 | P13 | P14 |
|----|----|-----|-----|-----|-----|
| 0 | 0 | Saturation | Linear | Saturation | Linear |
| 0 | 1 | Saturation | Linear | Linear | Saturation |
| 1 | 0 | Linear | Saturation | Saturation | Linear |
| 1 | 1 | Linear | Saturation | Linear | Saturation |

Figure 2A:
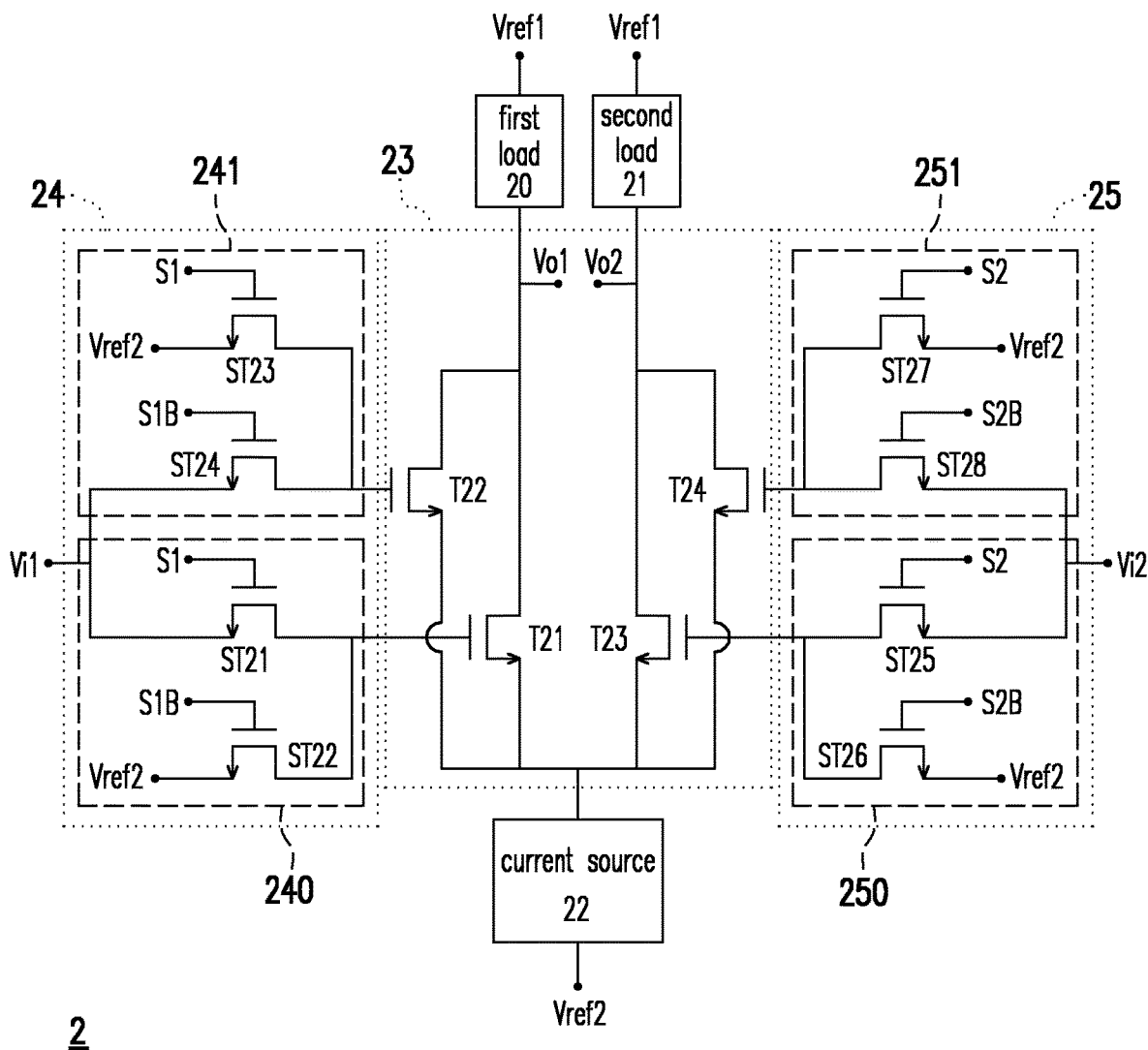
FIG. 2A is a schematic diagram of a differential amplifier in accordance with some embodiments.

Please refer to FIG. 2A, which is a schematic diagram of a differential amplifier 2 in accordance with some embodiments. The differential amplifier 2 includes a first load 20, a second load 21, a current source 22, a differential pair circuit 23, a first switch circuit 24, a second switch circuit 25. Specifically, the differential pair circuit 23 includes a first transistors T21, a second transistor T22, a third transistor T23, and a fourth transistor T24. The extra transistors T21-T24 in the differential pair circuit 23 enables the differential amplifier 2 to select two certain transistors from the transistors T21-T24 for processing the first and the second input signals Vi1 and Vi2 and further preventing the RTN issue. The differential amplifier 2 illustrated in FIG. 2A is similar to the differential amplifier 1 illustrated in FIG. 1A, except that the first transistor T21 and the second transistor T22 of the differential amplifier 2 are parallelly connected between the first load 20 and the current source 22, but the first transistor T11 and the second transistor T12 of the differential amplifier 1 are serially connected between the first load 10 and the current source 12.

Specifically, the first transistor T21 has a first terminal (e.g. drain terminal), a second terminal (e.g. source terminal) and a control terminal (e.g. gate terminal). The second transistor T22 has a first terminal (e.g. drain terminal), a second terminal (e.g. source terminal) and a control terminal (e.g. gate terminal). The first terminal of the first transistor T21 is coupled to the first load 20. The second terminal of the first transistor T21 is coupled to the current source 22. The first terminal of the second transistor T22 is coupled to the first load 20. The second terminal of the second transistor T22 is coupled to the current source 22. The control terminal of the first transistor T21 and the control terminal of the second transistor T22 are coupled to the first switch circuit 24. The first transistor T21 and the second transistor T22 are parallelly connected between the first load 20 and the current source 22.

The third transistor T23 has a first terminal (e.g. drain terminal), a second terminal (e.g. source terminal) and a control terminal (e.g. gate terminal). The fourth transistor T24 has a first terminal (e.g. drain terminal), a second terminal (e.g. source terminal) and a control terminal (e.g. gate terminal). The first terminal of the third transistor T23 is coupled to the second load 21. The second terminal of the third transistor T23 is coupled to the current source 22. The first terminal of the fourth transistor T24 is coupled to the second load 21. The second terminal of the fourth transistor T24 is coupled to the current source 22. The control terminal of the third transistor T23 and the control terminal of the fourth transistor T24 are coupled to the second switch circuit 25. The third transistor T23 and the fourth transistor T24 are parallelly connected between the second load 21 and the current source 22.

The first transistor T21 may be, for example but not limited to, a metal-oxide-semiconductor field-effect transistor (MOSFET), a bipolar junction transistor (BJT) or the like. The second transistor T22 may be, for example but not limited to, a metal-oxide-semiconductor field-effect transistor (MOSFET), a bipolar junction transistor (BJT) or the like. The third transistor T23 may be, for example but not limited to, a metal-oxide-semiconductor field-effect transistor (MOSFET), a bipolar junction transistor (BJT) or the like. The fourth transistor T24 may be, for example but not limited to, a metal-oxide-semiconductor field-effect transistor (MOSFET), a bipolar junction transistor (BJT) or the like.

The first load 20 may include passive components (e.g. resistors, capacitors, inductors or the like), active components (e.g. transistors) or the combination thereof. The second load 21 may include passive components (e.g. resistors, capacitors, inductors or the like), active components (e.g. transistors) or the combination thereof. In one embodiment, the first load 20 and the second load 21 can be integrated as a single load circuit connected to the first to fourth transistors T21-T24. For example, the integrated load may be a cross-coupled pair.

The first switch circuit 24 is controlled by the first control signal S1 and an inverted first control signal S1B to determine whether to provide the first input signal Vi1 to the first transistor T21 or the second transistor T22. The inverted first control signal SIB is generated by inverting the sign of the first control signal S1 through an inverter (not illustrated in FIG. 2A). When the first switch circuit 24 provides the first input signal Vi1 to the control terminal of one of the first transistor T21 and the second transistor T22, the first switch circuit 24 provides the second reference voltage Vref2 to the control terminal of another one of the first transistor T21 and the second transistor T22.

Specifically, the first switch circuit 24 includes a first switch 240 and a second switch 241. The first switch 240 is coupled to the control terminal of the first transistor T21. The second switch 241 is coupled to the control terminal of the first transistor T22. The first switch 240 and the second switch 241 are controlled by the first control signal S1 and the inverted first control signal S1B. When the first switch 240 provides one of the first input signal Vi1 and the second reference voltage Vref2 to the control terminal of the first transistor T21, the second switch 241 provides another one of the first input signal S1 and the second reference voltage Vref2 to the control terminal of the second transistor T22.

The first switch 240 includes a first switch transistor ST21 and a second switch transistor ST22. The first switch transistor ST21 has a first terminal (e.g. drain terminal), a second terminal (e.g. source terminal) and a control terminal (e.g. gate terminal). The second switch transistor ST22 has a first terminal (e.g. drain terminal), a second terminal (e.g. source terminal) and a control terminal (e.g. gate terminal). The first terminal of the first switch transistor ST21 is coupled to the control end of the first transistor T21. The second terminal of the first switch transistor ST21 is coupled to receive the first input signal Vi1. The control terminal of the first switch transistor ST21 is coupled to receive the first control signal S1. The first terminal of the second switch transistor ST22 is coupled to the control end of the first transistor T21. The second terminal of the second switch transistor ST22 is coupled to receive the second reference voltage Vref2. The control terminal of the second switch transistor ST22 is coupled to receive the inverted first control signal S1B.

The second switch 241 includes a third switch transistor ST23 and a fourth switch transistor ST24. The third switch transistor ST23 has a first terminal (e.g. drain terminal), a second terminal (e.g. source terminal) and a control terminal (e.g. gate terminal). The fourth switch transistor ST24 has a first terminal (e.g. drain terminal), a second terminal (e.g. source terminal) and a control terminal (e.g. gate terminal). The first terminal of the third switch transistor ST23 is coupled to the control end of the second transistor T22. The second terminal of the third switch transistor ST23 is coupled to receive the second reference voltage Vref2. The control terminal of the third switch transistor ST23 is coupled to receive the first control signal S1. The first terminal of the fourth switch transistor ST24 is coupled to the control end of the second transistor T22. The second terminal of the fourth switch transistor ST24 is coupled to receive the first input signal Vi1. The control terminal of the fourth switch transistor ST24 is coupled to receive the inverted first control signal S1B.

The second switch circuit 25 is controlled by the second control signal S2 and an inverted second control signal S2B to determine whether to provide the second input signal Vi2 to the third transistor T23 or the fourth transistor T24. The inverted second control signal S2B is generated by inverting the sign of the second control signal S2 through an inverter (not illustrated in FIG. 2A). When the second switch circuit 25 provides the second input signal Vi2 to the control terminal of one of the third transistor T23 and the fourth transistor T24, the second switch circuit 25 provides the second reference voltage Vref2 to the control terminal of another one of the third transistor T23 and the fourth transistor T24.

Specifically, the second switch circuit 25 includes a third switch 250 and a fourth switch 251. The third switch 250 is coupled to the control terminal of the third transistor T23. The fourth switch 251 is coupled to the control terminal of the first transistor T22. The third switch 250 and the fourth switch 251 are controlled by the second control signal S2 and the inverted second control signal S2B. When the third switch 250 provides one of the second input signal Vi2 and the second reference voltage Vref2 to the control terminal of the third transistor T23, the fourth switch 251 provides another one of the first input signal S1 and the second reference voltage Vref2 to the control terminal of the fourth transistor T24.

The third switch 250 includes a fifth switch transistor ST25 and a sixth switch transistor ST26. The fifth switch transistor ST25 has a first terminal (e.g. drain terminal), a second terminal (e.g. source terminal) and a control terminal (e.g. gate terminal). The sixth switch transistor ST26 has a first terminal (e.g. drain terminal), a second terminal (e.g. source terminal) and a control terminal (e.g. gate terminal). The first terminal of the fifth switch transistor ST25 is coupled to the control end of the third transistor T23. The second terminal of the fifth switch transistor ST25 is coupled to receive the second input signal Vi2. The control terminal of the fifth switch transistor ST25 is coupled to receive the second control signal S2. The first terminal of the sixth switch transistor ST26 is coupled to the control end of the third transistor T23. The second terminal of the sixth switch transistor ST26 is coupled to receive the second reference voltage Vref2. The control terminal of the sixth switch transistor ST26 is coupled to receive the inverted second control signal S2B.

The fourth switch 251 includes a seventh switch transistor ST27 and an eighth switch transistor ST28. The seventh switch transistor ST27 has a first terminal (e.g. drain terminal), a second terminal (e.g. source terminal) and a control terminal (e.g. gate terminal). The eighth switch transistor ST28 has a first terminal (e.g. drain terminal), a second terminal (e.g. source terminal) and a control terminal (e.g. gate terminal). The first terminal of the seventh switch transistor ST27 is coupled to the control end of the fourth transistor T24. The second terminal of the seventh switch transistor ST27 is coupled to receive the second reference voltage Vref2. The control terminal of the seventh switch transistor ST27 is coupled to receive the second control signal S2. The first terminal of the eighth switch transistor ST28 is coupled to the control end of the fourth transistor T24. The second terminal of the eighth switch transistor ST28 is coupled to receive the second input signal Vi2. The control terminal of the eighth switch transistor ST28 is coupled to receive the inverted second control signal S2B.

For example, if the first transistor T21 is determined to cause RTN during processing the first input signal Vi1, another transistor (i.e. second transistor T22) may be selected to receive and process the first input signal Vi1 without deteriorating the first output signal Vo1. In addition, since the first transistor T21 and the second transistor T22 are parallelly connected, the second reference voltage Vref2 is provided to the unselected first transistor T21 to keep the first transistor T21 cutoff. Similarly, one of the third transistor T23 and the fourth transistor T24 may be selected to provide the second input signal Vi2, and the another one may be provided with the second reference voltage Vref2. A differential input pair can be formed by selecting one transistor from the first and the second transistors T21 and T22, and selecting another transistor from the third and the fourth transistors T23 and T24. As a result, the differential amplifier 2 can effectively avoid using the transistors which would cause RTN for signal processing to further improve the signal integrity.

Therefore, through the control of the first control signal S1, the first input signal Vi1 may be provided to one of the first transistor T21 and the second transistor T22 while the second reference voltage Vref2 may be provided to another one of the first transistor T21 and the second transistor T22. Through the control of the second control signal S2, the second input signal Vi2 may be provided to one of the third transistor T23 and the fourth transistor T24 while the second reference voltage Vref2 may be provided to another one of the third transistor T23 and the fourth transistor T24.

Figure 2B:
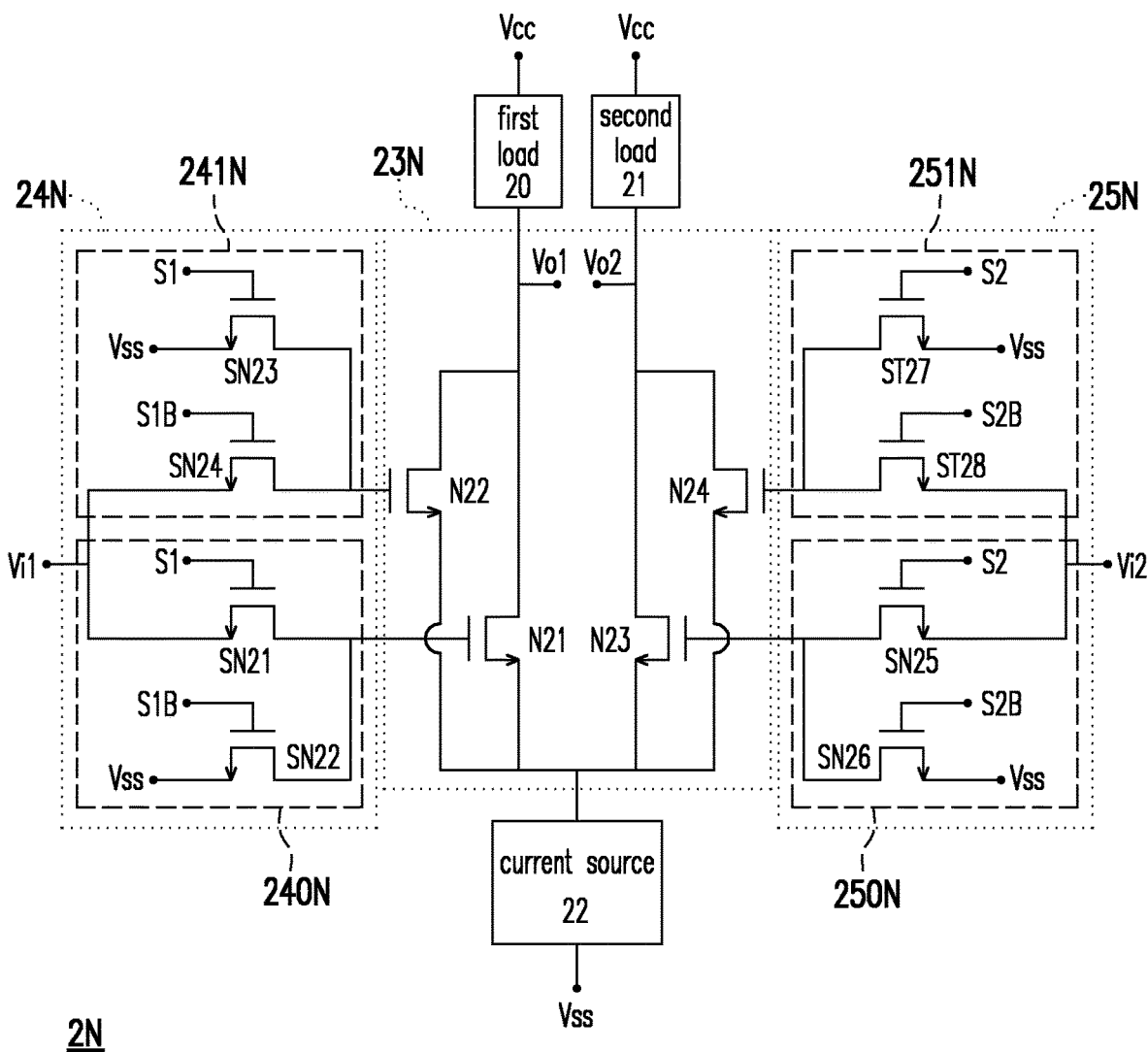
FIG. 2B is a schematic diagram of a differential amplifier in accordance with some embodiments.

Please refer to FIG. 2B, which is a schematic diagram of a differential amplifier 2N in accordance with some embodiments. The differential amplifier 2N includes a first load 20, second load 21, a current source 22, a first switch circuit 24N, a second switch circuit 25N and a first transistor N21, a second transistor N22, a third transistor N23 and a fourth transistor N24. The first switch circuit 24N includes a first switch 240N and a second switch 241N. The second switch circuit 25N includes a third switch 250N and a fourth switch 251N. The first switch 240N includes a first switch transistor SN21 and a second switch transistor SN22. The second switch 241N includes a third switch transistor SN23 and a fourth switch transistor SN24. The third switch 250N includes a fifth switch transistor SN25 and a sixth transistor SN26. The fourth switch 251N includes a seventh switch transistor SN27 and an eighth transistor SN28.

The differential amplifier 2N illustrated in FIG. 2B is similar to the differential amplifier 2 illustrated in FIG. 2A, except that some of the transistors in the differential amplifier 2N are N-type MOSFETs. Specifically, the first transistor N21, the second transistor N22, the third transistor N23, the fourth transistor N24, the first switch transistor SN21, the second switch transistor SN22, the third switch transistor SN23, the fourth switch transistor SN24, the fifth switch transistor SN25, the sixth switch transistor SN26, the seventh switch transistor SN27 and the eighth switch transistor SN28 are N-type MOSFETs. In order to supply the operation of the differential amplifier 2N and to cutoff the first to fourth transistors N21-N24, an operation voltage Vcc, which replaces the first reference voltage Vref1 illustrated in FIG. 2A, is provided to the first load 20, the second load 21, the first switch 24N and the second switch 24N, and a ground voltage Vss, which replaces the first reference voltage Vref2 illustrated in FIG. 2A, is provided to the current source 22. In operation, one transistor from the first and the second transistors N21, N22 is selected, and another one transistor from the third and the fourth transistors N23. N24 is selected. The first and the second input signals Vi1. Vi2 are provided to the selected transistors, and the ground voltage is provided to those unselected transistors. Please refer to Table III as shown below for the operation of each transistors N21-N24 corresponding to the first and the second control signals S1 and S2. The first control signal S1 corresponds to the operation of the first transistor N21 and the second control signal S2 corresponds to the operation of the third transistor N23. When the first control signal S1 with low voltage (i.e. logic 0) is provided to the first switch circuit 24N, the first transistor N21 receives the ground voltage Vss and is operated in the cutoff region. When the first control signal S1 with high voltage (i.e. logic 1) is provided to the first switch circuit 24N, the first transistor N21 receives the first input signal Vi1 and is operated in the saturation region. When the second control signal S2 with low voltage (i.e. logic 0) is provided to the second switch circuit 25N, the third transistor N23 receives the ground voltage Vss and is operated in the cutoff region. When the second control signal S2 with high voltage (i.e. logic 1) is provided to the second switch circuit 25N, the third transistor N23 receives the second input signal Vi2 and is operated in the saturation region.

TABLE III

| S1 | S2 | N21 | N22 | N23 | N24 |
|---|---|---|---|---|---|
| 0 | 0 | Cutoff | Saturation | Cutoff | Saturation |
| 0 | 1 | Cutoff | Saturation | Saturation | Cutoff |
| 1 | 0 | Saturation | Cutoff | Cutoff | Saturation |
| 1 | 1 | Saturation | Cutoff | Saturation | Cutoff |

Figure 2C:
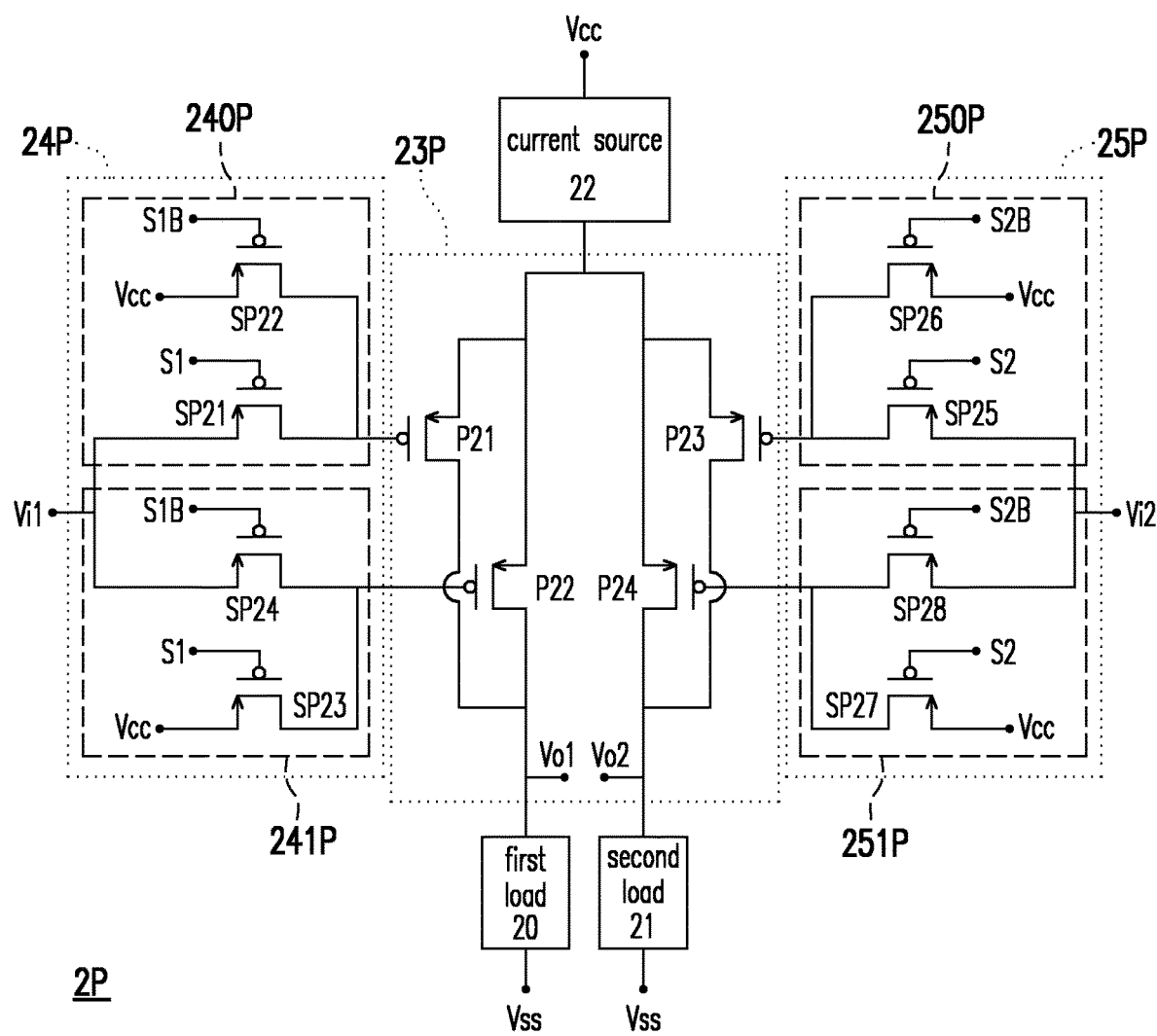
FIG. 2C is a schematic diagram of a differential amplifier in accordance with some embodiments.

Please refer to FIG. 2C, which is a schematic diagram of a differential amplifier 2P in accordance with some embodiments. The differential amplifier 2P includes a first load 20, a second load 21, a current source 22, a first switch circuit 24P, a second switch circuit 25P and a first transistor P21, a second transistor P22, a third transistor P23 and a fourth transistor P24. The first switch circuit 24P includes a first switch 240P and a second switch 241P. The second switch circuit 25P includes a third switch 250P and a fourth switch 251P. The first switch 240P includes a first switch transistor SP21 and a second switch transistor SP22. The second switch 241P includes a third switch transistor SP23 and a fourth switch transistor SP24. The third switch 250P includes a fifth switch transistor SP25 and a sixth transistor SP26. The fourth switch 251P includes a seventh switch transistor SP27 and an eighth transistor SP28.

The differential amplifier 2P illustrated in FIG. 2C is similar to the differential amplifier 2 illustrated in FIG. 2A, except that some of the transistors in the differential amplifier 2P are P-type MOSFETs. Specifically, the first transistor P21, the second transistor P22, the third transistor P23, the fourth transistor P24, the first switch transistor SP21, the second switch transistor SP22, the third switch transistor SP23, the fourth switch transistor SP24, the fifth switch transistor SP25, the sixth switch transistor SP26, the seventh switch transistor SP27 and the eighth switch transistor SP28 are P-type MOSFETs. In order to supply the operation of the differential amplifier 2P and to conduct the first to fourth transistors P21-P24, the ground voltage Vss, which replaces the first reference voltage Vref1 illustrated in FIG. 2A, is provided to the first load 20 and the second load 21, and the operation voltage Vcc, which replaces the second reference voltage Vref2 illustrated in FIG. 2A, is provided to the current source 22, the first switch circuit 24P and the second switch circuit 25P. In operation, one transistor from the first and the second transistors P21, P22 is selected and another one transistor from the third and the fourth transistors P23, P24 is selected. The first and the second input signals Vi1, Vi2 are provided to the selected transistors, and the operation voltage Vcc is provided to those unselected transistors. Please refer to Table IV as shown below for the operation of each transistors P21-P24 corresponding to the first and the second control signals S1 and S2. The first control signal S1 corresponds to the operation of the first transistor P21 and the second control signal S2 corresponds to the operation of the third transistor P23. When the first control signal S1 with low voltage (i.e. logic 0) is provided to the first switch circuit 24P, the first transistor P21 receives the first input signal Vi1 and is operated in the saturation region. When the first control signal S1 with high voltage (i.e. logic 1) is provided to the first switch circuit 24P, the first transistor P21 receives operation voltage Vcc and is operated in the cutoff region. When the second control signal S2 with low voltage (i.e. logic 0) is provided to the second switch circuit 25P, the third transistor P23 receives the second input signal Vi2 and is operated in the saturation region. When the second control signal S2 with high voltage (i.e. logic 1) is provided to the second switch circuit 25P, the third transistor P23 receives the operation voltage Vcc and is operated in the cutoff region.

TABLE IV

| S1 | S2 | P21 | P22 | P23 | P24 |
|----|----|-----|-----|-----|-----|
| 0 | 0 | Saturation | Cutoff | Saturation | Cutoff |
| 0 | 1 | Saturation | Cutoff | Cutoff | Saturation |
| 1 | 0 | Cutoff | Saturation | Saturation | Cutoff |
| 1 | 1 | Cutoff | Saturation | Cutoff | Saturation |

Figure 3A:
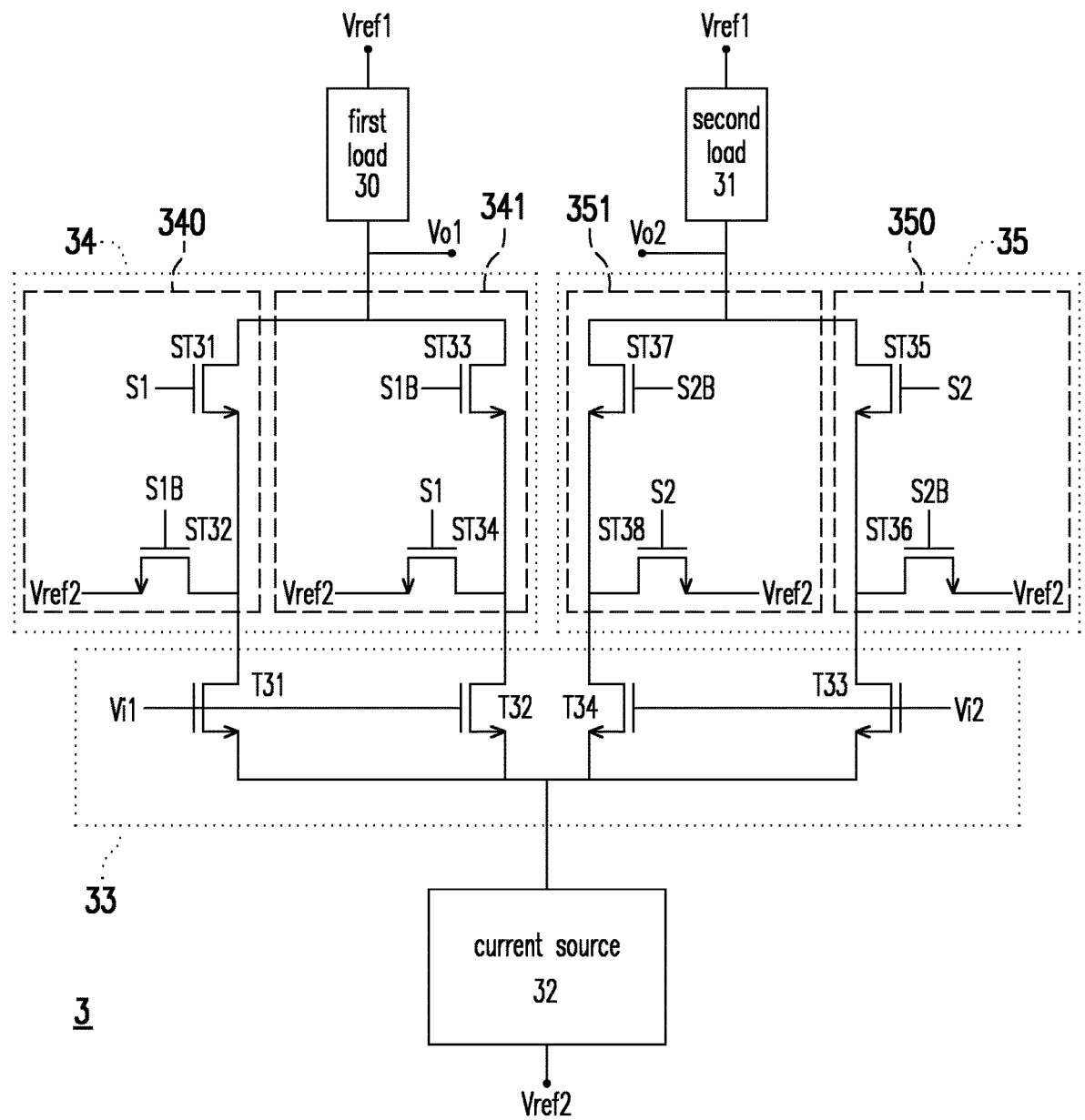
FIG. 3A is a schematic diagram of a differential amplifier in accordance with some embodiments.

Please refer to FIG. 3A, which is a schematic diagram of a differential amplifier 3 in accordance with some embodiments. The differential amplifier 3 includes a first load 30, a second load 31, a current source 32, a differential pair circuit 33, a first switch circuit 34, a second switch circuit 35. Specifically, the differential pair circuit 33 includes a first transistor T31, a second switch transistor T32, a third switch transistor T33 and a fourth transistor T34. These extra transistors T31-T34 in the differential pair circuit 33 enables the differential amplifier 3 to select two certain transistors from the transistors T21-T24 for processing the first and the second input signals Vi1 and Vi2 and further preventing the RTN issue.

The first transistor T31 has a first terminal (e.g. drain terminal), a second terminal (e.g. source terminal) and a control terminal (e.g. gate terminal). The second transistor T32 has a first terminal (e.g. drain terminal), a second terminal (e.g. source terminal) and a control terminal (e.g. gate terminal). The first terminal of the first transistor T31 is coupled to the first load 30 through the first switch circuit 34. The second terminal of the first transistor T31 is coupled to the current source 32. The first terminal of the second transistor T32 is coupled to the first load 30 through the first switch circuit 34. The second terminal of the second transistor T32 is coupled to the current source 32. The control terminal of the first transistor T31 and the control terminal of the second transistor T32 are coupled to receive the first input signal Vi1. The first transistor T31 and the second transistor T32 are parallelly connected between the first load 30 and the current source 32.

The third transistor T33 has a first terminal (e.g. drain terminal), a second terminal (e.g. source terminal) and a control terminal (e.g. gate terminal). The fourth transistor T34 has a first terminal (e.g. drain terminal), a second terminal (e.g. source terminal) and a control terminal (e.g. gate terminal). The first terminal of the third transistor T33 is coupled to the second load 31 through the second switch circuit 35. The second terminal of the third transistor T33 is coupled to the current source 32. The first terminal of the fourth transistor T34 is coupled to the second load 31 through the second switch circuit 35. The second terminal of the fourth transistor T34 is coupled to the current source 32. The control terminal of the third transistor T33 and the control terminal of the fourth transistor T34 are coupled to receive the second input signal S2. The third transistor T33 and the fourth transistor T34 are parallelly connected between the second load 31 and the current source 32.

The first transistor T31 may be, for example but not limited to, a metal-oxide-semiconductor field-effect transistor (MOSFET), a bipolar junction transistor (BJT) or the like. The second transistor T32 may be, for example but not limited to, a metal-oxide-semiconductor field-effect transistor (MOSFET), a bipolar junction transistor (BJT) or the like. The third transistor T33 may be, for example but not limited to, a metal-oxide-semiconductor field-effect transistor (MOSFET), a bipolar junction transistor (BJT) or the like. The fourth transistor T34 may be, for example but not limited to, a metal-oxide-semiconductor field-effect transistor (MOSFET), a bipolar junction transistor (BJT) or the like.

The first load 30 may include passive components (e.g. resistors, capacitors, inductors or the like), active components (e.g. transistors) or the combination thereof. The second load 31 may include passive components (e.g. resistors, capacitors, inductors or the like), active components (e.g. transistors) or the combination thereof. In one embodiment, the first load 30 and the second load 31 can be integrated as a single load circuit connected to the first to fourth transistors T31-T34. For example, the integrated load may be a cross-coupled pair.

The first switch circuit 34 is controlled by the first control signal S1 and an inverted first control signal S1B to determine whether to connect the first transistor T31 or the second transistor T32 to the first load 30. The inverted first control signal S1B is generated by inverting the sign of the first control signal S1 through an inverter (not illustrated in FIG. 3A). When the first switch circuit 34 provides a connection from one of the first transistors T31, T32 to the first load 30, the first switch circuit 34 provides a connection from another one of the first and the second transistors T31, T32 to receive the second reference voltage Vref2.

Specifically, the first switch circuit 34 includes a first switch 340 and a second switch 341. The first switch 340 is coupled between the first transistor T31 and the first load 30. The second switch 341 is coupled between the second transistor T32 and the first load 30. The first switch 340 and the second switch 341 are controlled by the first control signal S1 and the inverted first control signal S1B. When the first switch 340 provides the connection from one of the first load 30 and the second reference voltage Vref2 to the first terminal of the first transistor T31, the second switch 341 provides the connection from another one of the first load 30 and the second reference voltage Vref2 to the first terminal of the second transistor T32.

The first switch 340 includes a first switch transistor ST31 and a second switch transistor ST32. The first switch transistor ST31 has a first terminal (e.g. drain terminal), a second terminal (e.g. source terminal) and a control terminal (e.g. gate terminal). The second switch transistor ST32 has a first terminal (e.g. drain terminal), a second terminal (e.g. source terminal) and a control terminal (e.g. gate terminal). The first terminal of the first switch transistor ST31 is coupled to the first load 30. The second terminal of the first switch transistor ST31 is coupled to the first terminal of the first transistor T31. The control terminal of the first switch transistor ST31 is coupled to receive the first control signal S1. The first terminal of the second switch transistor ST32 is coupled to the first terminal of the first transistor T31. The second terminal of the second switch transistor ST32 is coupled to receive the second reference voltage Vref2. The control terminal of the second switch transistor ST32 is coupled to receive the inverted first control signal S1B.

The second switch 341 includes a third switch transistor ST33 and a fourth switch transistor ST34. The third switch transistor ST33 has a first terminal (e.g. drain terminal), a second terminal (e.g. source terminal) and a control terminal (e.g. gate terminal). The fourth switch transistor ST34 has a first terminal (e.g. drain terminal), a second terminal (e.g. source terminal) and a control terminal (e.g. gate terminal). The first terminal of the third switch transistor ST33 is coupled to the first load 30. The second terminal of the third switch transistor ST33 is coupled to the first terminal of the second transistor T32. The control terminal of the third switch transistor ST33 is coupled to receive the second control signal S2. The first terminal of the fourth switch transistor ST34 is coupled to the first terminal of the second transistor T32. The second terminal of the fourth switch transistor ST34 is coupled to receive the second reference voltage Vref2. The control terminal of the fourth switch transistor ST34 is coupled to receive the inverted second control signal S2B.

The second switch circuit 35 is controlled by the second control signal S2 and an inverted second control signal S2B to determine whether to connect the third transistor T33 or the fourth transistor T34 to the second load 30. The inverted second control signal S2B is generated by inverting the sign of the second control signal S2 through an inverter (not illustrated in FIG. 3A). When the second switch circuit 35 provides a connection from one of the third and the fourth transistors T33, T34 to the second load 31, the second switch circuit 35 provides a connection from another one of the third and the fourth transistors T33, T34 to receive the second reference voltage Vref2.

Specifically, the second switch circuit 35 includes a third switch 350 and a fourth switch 351. The third switch 350 is coupled between the third transistor T33 and the second load 31. The fourth switch 351 is coupled between the fourth transistor T34 and the second load 31. The third switch 350 and the fourth switch 351 are controlled by the second control signal S2 and the inverted second control signal S2B. When the third switch 350 provides the connection from one of the second load 31 and the second reference voltage Vref2 to the first terminal of the third transistor T33, the fourth switch 351 provides the connection from another one of the second load 31 and the second reference voltage Vref2 to the first terminal of the fourth transistor T34.

The third switch 350 includes a fifth switch transistor ST35 and a sixth switch transistor ST36. The fifth switch transistor ST35 has a first terminal (e.g. drain terminal), a second terminal (e.g. source terminal) and a control terminal (e.g. gate terminal). The sixth switch transistor ST36 has a first terminal (e.g. drain terminal), a second terminal (e.g. source terminal) and a control terminal (e.g. gate terminal). The first terminal of the fifth switch transistor ST35 is coupled to the second load 31. The second terminal of the fifth switch transistor ST35 is coupled to the first terminal of the third transistor T33. The control terminal of the fifth switch transistor ST35 is coupled to receive the second control signal S2. The first terminal of the sixth switch transistor ST36 is coupled to the first terminal of the third transistor T33. The second terminal of the sixth switch transistor ST36 is coupled to receive the second reference voltage Vref2. The control terminal of the sixth switch transistor ST36 is coupled to receive the inverted second control signal S2B.

The fourth switch 351 includes a seventh switch transistor ST37 and an eighth switch transistor ST38. The seventh switch transistor ST37 has a first terminal (e.g. drain terminal), a second terminal (e.g. source terminal) and a control terminal (e.g. gate terminal). The eighth switch transistor ST38 has a first terminal (e.g. drain terminal), a second terminal (e.g. source terminal) and a control terminal (e.g. gate terminal). The first terminal of the seventh switch transistor ST37 is coupled to the second load 31. The second terminal of the seventh switch transistor ST37 is coupled to the first terminal of the fourth transistor T34. The control terminal of the seventh switch transistor ST37 is coupled to receive the second control signal S2. The first terminal of the eighth switch transistor ST38 is coupled to the first terminal of the fourth transistor T34. The second terminal of the eighth switch transistor ST38 is coupled to receive the second reference voltage Vref2. The control terminal of the eighth switch transistor ST38 is coupled to receive the inverted second control signal S2B.

For example, if the first transistor T31 is determined to cause RTN during processing the first input signal Vi1, another transistor (i.e. second transistor T22) may be selected to receive and process the first input signal Vi1 without deteriorating the first output signal Vo1. In addition, since the first transistor T31 and the second transistor T32 are parallelly connected, the second reference voltage Vref2 is provided to the first terminal of the unselected first transistor T31 to keep the first transistor T31 cutoff. Similarly, one of the third transistor T33 and the fourth transistor T34 may be selected to provide the second input signal Vi2, the second reference voltage Vref2 may be provided to the first terminal of the unselected transistor. A differential input pair can be formed by selecting one transistor from the first and the second transistors T31 and T32, and selecting another transistor from the third and the fourth transistors T33 and T34. As a result, the differential amplifier 3 can effectively avoid using the transistors which would cause RTN for signal processing to further improve the signal integrity.

Figure 3B:
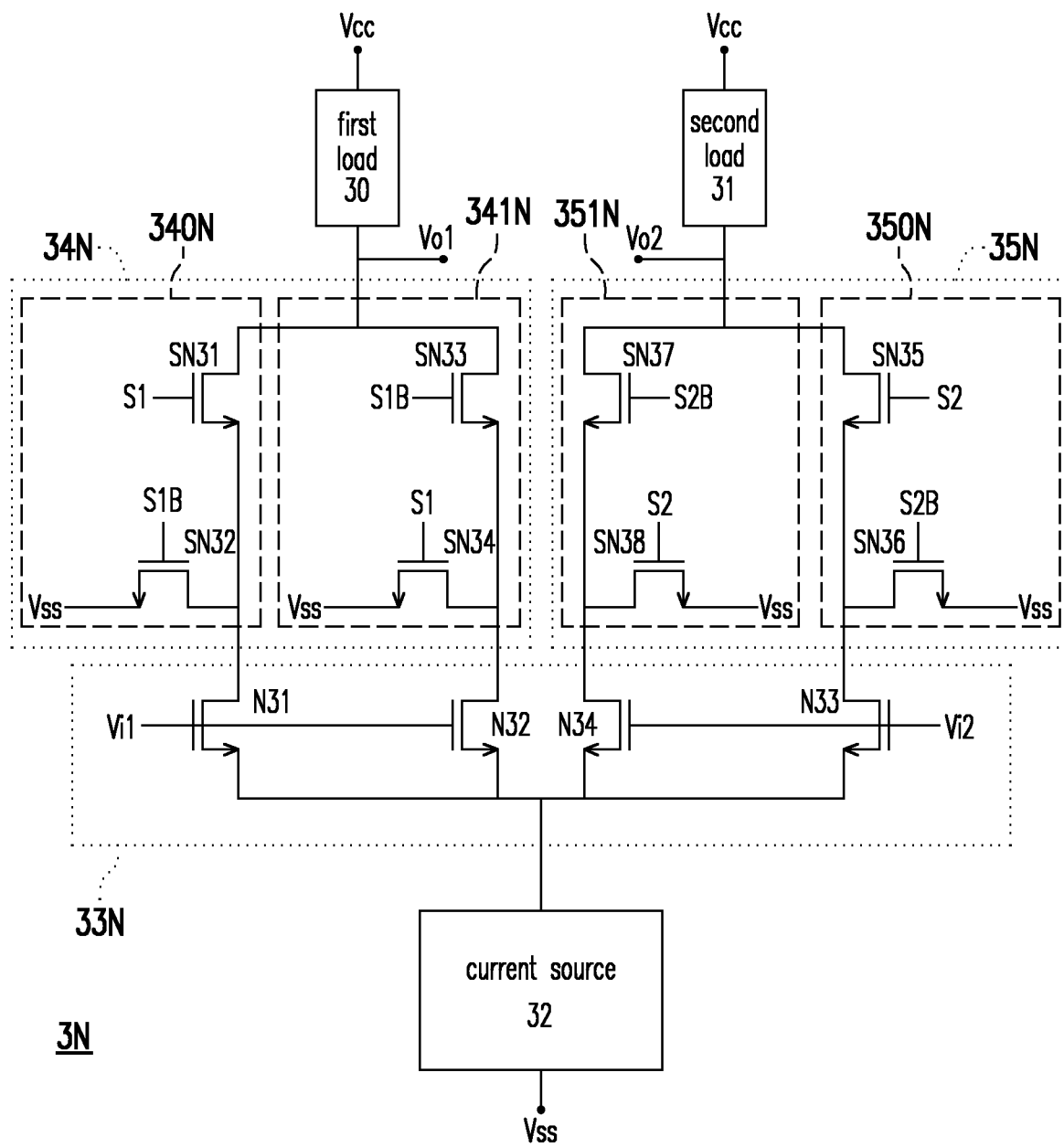
FIG. 3B is a schematic diagram of a differential amplifier in accordance with some embodiments.

Please refer to FIG. 3B, which is a schematic diagram of a differential amplifier 3N in accordance with some embodiments. The differential amplifier 3N includes a first load 30, second load 31, a current source 32, a first switch circuit 34N, a second switch circuit 35N and a first transistor N31, a second transistor N32, a third transistor N33 and a fourth transistor N34. The first switch circuit 34N includes a first switch 340N and a second switch 341N. The second switch circuit 35N includes a third switch 350N and a fourth switch 351N. The first switch 340N includes a first switch transistor SN31 and a second switch transistor SN32. The second switch 341N includes a third switch transistor SN33 and a fourth switch transistor SN34. The third switch 350N includes a fifth switch transistor SN35 and a sixth transistor SN36. The fourth switch 351N includes a seventh switch transistor SN37 and an eighth transistor SN38.

The differential amplifier 3N illustrated in FIG. 3B is similar to the differential amplifier 3 illustrated in FIG. 3A, except that some of the transistors in the differential amplifier 3N are N-type MOSFETs. Specifically, the first transistor N31, the second transistor N32, the third transistor N33, the fourth transistor N34, the first switch transistor SN31, the second switch transistor SN32, the third switch transistor SN33, the fourth switch transistor SN34, the fifth switch transistor SN35, the sixth switch transistor SN36, the seventh switch transistor SN37 and the eighth switch transistor SN38 are N-type MOSFETs. In order to supply the operation of the differential amplifier 3N and to cutoff the first to fourth transistors N31-N34, an operation voltage Vcc, which replaces the first reference voltage Vref1 illustrated in FIG. 3A, is provided to the first load 30 and the second load 31, and a ground voltage Vss, which replaces the second reference voltage Vref2 illustrated in FIG. 3A, is provided to the current source 32, the first switch circuit 34N and the second switch circuit 35N. In operation, the first input signal Vi1 is provided to both of the first transistor N31 and the second transistor N32, and the second input signal Vi2 is provided to both of the third transistor N33 and the fourth transistor N34. One transistor is selected from the transistors N31 and N32 to process the first input signal Vi1 and one transistor is selected from the transistors N33 and N34 to process the second input signal Vi2. The first terminals of those unselected transistors are provided with the ground voltage Vss. Please refer to Table V as shown below for the operation of each transistors N31-N34 corresponding to the first and the second control signals S1 and S2. The first control signal S1 corresponds to the operation of the first transistor N31 and the second control signal S2 corresponds to the operation of the third transistor N33. When the first control signal S1 with low voltage (i.e. logic 0) is provided to the first switch circuit 34N, the first terminal of the first transistor N31 receives the ground voltage Vss and is operated in the cutoff region. When the first control signal S1 with high voltage (i.e. logic 1) is provided to the first switch circuit 34N, the first terminal of the first transistor N31 is coupled to the first load 30 and is operated in the saturation region. When the second control signal S2 with low voltage (i.e. logic 0) is provided to the second switch circuit 35N, the first terminal of the third transistor N33 receives the ground voltage Vss and is operated in the cutoff region. When the second control signal S2 with high voltage (i.e. logic 1) is provided to the first terminal of the second switch circuit 35N, the first terminal of the third transistor N33 is coupled to the second load 31 and is operated in the saturation region.

TABLE V

| S1 | S2 | N31 | N32 | N33 | N34 |
|----|----|-----|-----|-----|-----|
| 0 | 0 | Cutoff | Saturation | Cutoff | Saturation |
| 0 | 1 | Cutoff | Saturation | Saturation | Cutoff |
| 1 | 0 | Saturation | Cutoff | Cutoff | Saturation |
| 1 | 1 | Saturation | Cutoff | Saturation | Cutoff |

Figure 3C:
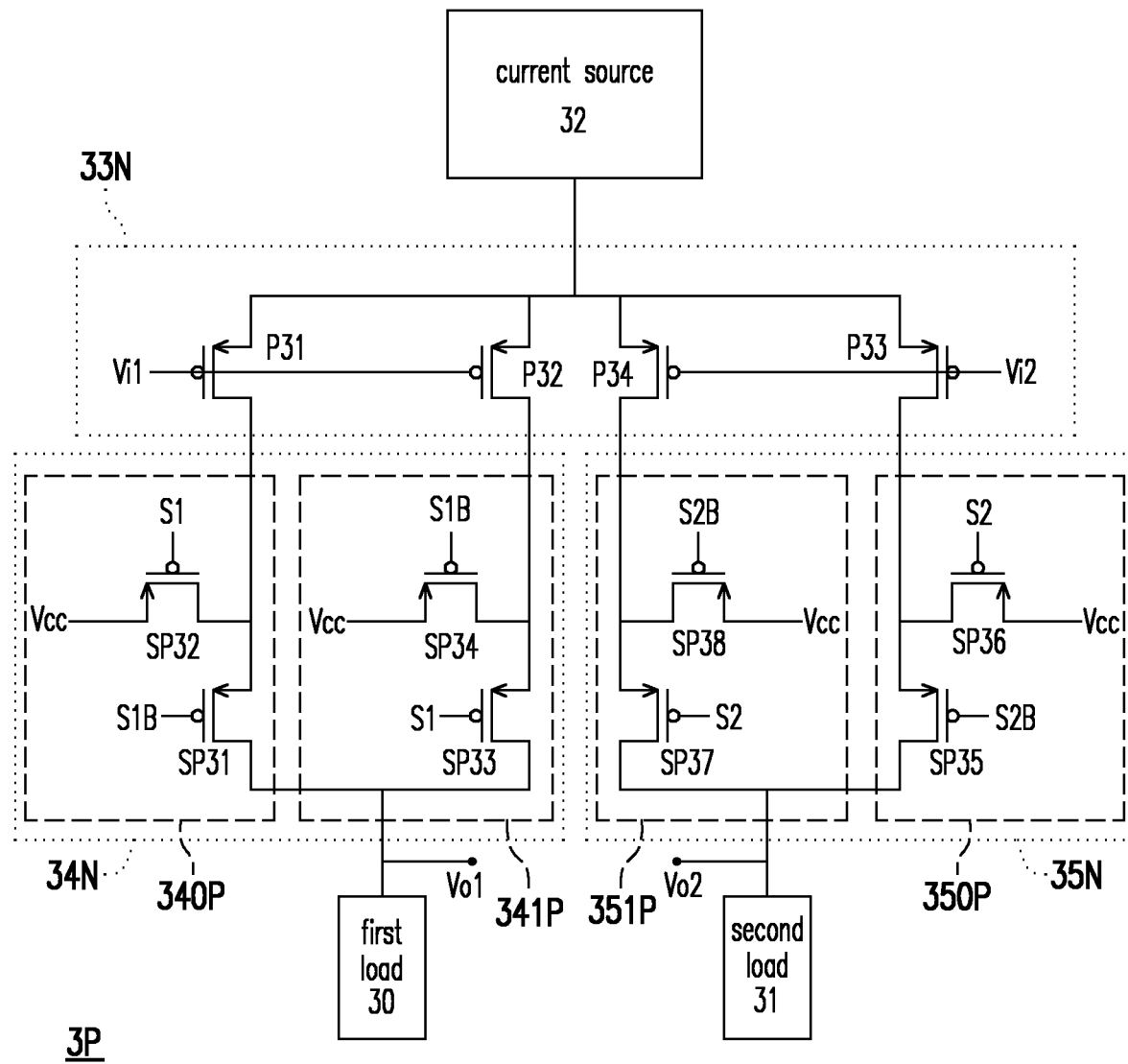
FIG. 3C is a schematic diagram of a differential amplifier in accordance with some embodiments.

Please refer to FIG. 3C, which is a schematic diagram of a differential amplifier 3P in accordance with some embodiments. The differential amplifier 3P includes a first load 30, second load 31, a current source 32, a first switch circuit 34P, a second switch circuit 35P and a first transistor P31, a second transistor P32, a third transistor P33 and a fourth transistor P34. The first switch circuit 34P includes a first switch 340P and a second switch 341P. The second switch circuit 35P includes a third switch 350P and a fourth switch 351P. The first switch 340P includes a first switch transistor SP31 and a second switch transistor SP32. The second switch 341P includes a third switch transistor SP33 and a fourth switch transistor SP34. The third switch 350P includes a fifth switch transistor SP35 and a sixth transistor SP36. The fourth switch 351P includes a seventh switch transistor SP37 and an eighth transistor SP38.

The differential amplifier 3P illustrated in FIG. 3C is similar to the differential amplifier 3 illustrated in FIG. 3A, except that some of the transistors in the differential amplifier 3P are P-type MOSFETs. Specifically, the first transistor P31, the second transistor P32, the third transistor P33, the fourth transistor P34, the first switch transistor SP31, the second switch transistor SP32, the third switch transistor SP33, the fourth switch transistor SP34, the fifth switch transistor SP35, the sixth switch transistor SP36, the seventh switch transistor SP37 and the eighth switch transistor SP38 are P-type MOSFETs. In order to supply the operation of the differential amplifier 3P and to cutoff the first to fourth transistors P31-P34, a ground voltage Vss, which replaces the first reference voltage Vref1 illustrated in FIG. 3A, is provided to the first load 30 and the second load 31, and an operation voltage Vcc, which replaces the first reference voltage Vref2 illustrated in FIG. 3A, is provided to the current source 32, the first switch circuit 34P and the second switch circuit 35P. In operation, the first input signal Vi1 is provided to both of the first transistor P31 and the second transistor P32, and the second input signal Vi2 is provided to both of the third transistor P33 and the fourth transistor P34. One transistor is selected from the transistors P31 and P32 to process the first input signal Vi1 and one transistor is selected from the transistors P33 and P34 to process the second input signal Vi2. The first terminals of those unselected transistors are provided with the operation voltage Vcc. Please refer to Table VI as shown below for the operation of each transistors P31-P34 corresponding to the first and the second control signals S1 and S2. The first control signal S1 corresponds to the operation of the first transistor P31 and the second control signal S2 corresponds to the operation of the third transistor P33. When the first control signal S1 with low voltage (i.e. logic 0) is provided to the first switch circuit 34P, the first terminal of the first transistor P31 is coupled to the first load 30 and is operated in the saturation region. When the first control signal S1 with high voltage (i.e. logic 1) is provided to the first switch circuit 34P, the first terminal of the first transistor P31 receives the operation voltage Vcc and is operated in the cutoff region. When the second control signal S2 with low voltage (i.e. logic 0) is provided to the second switch circuit 35P, the first terminal of the third transistor P33 is coupled to the second load 31 and is operated in the saturation region. When the second control signal S2 with high voltage (i.e. logic 1) is provided to the first terminal of the second switch circuit 35P, the first terminal of the third transistor P33 receives the operation voltage Vcc and is operated in the cutoff region.

TABLE VI

| S1 | S2 | P21 | P22 | P23 | P24 |
|----|----|-----|-----|-----|-----|
| 0 | 0 | Saturation | Cutoff | Saturation | Cutoff |
| 0 | 1 | Saturation | Cutoff | Cutoff | Saturation |
| 1 | 0 | Cutoff | Saturation | Saturation | Cutoff |
| 1 | 1 | Cutoff | Saturation | Cutoff | Saturation |

Figure 4A:
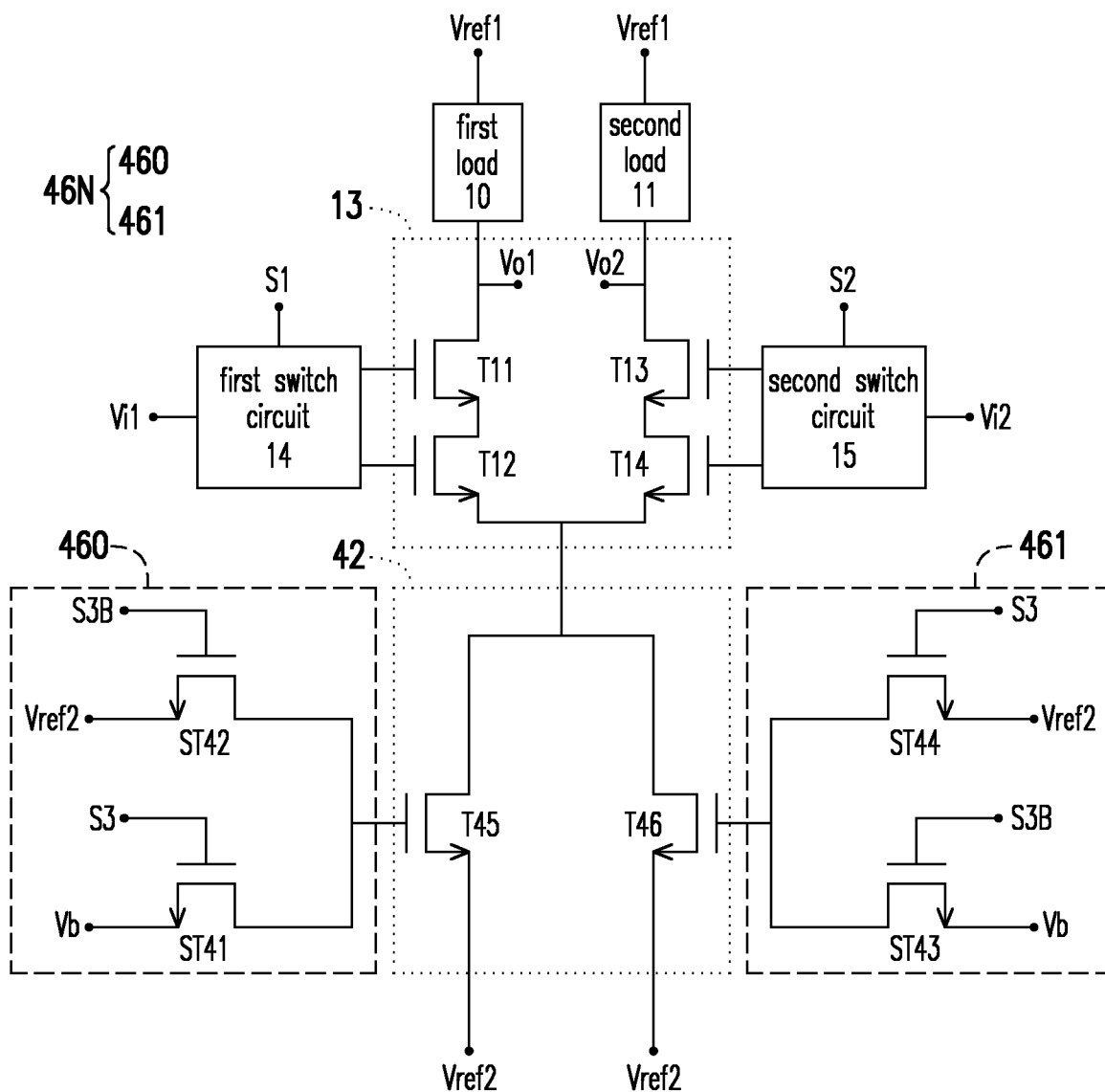
FIG. 4A is a schematic diagram of a differential amplifier in accordance with some embodiments.

Please refer to FIG. 4A, which is a schematic diagram of a differential amplifier 4 in accordance with some embodiments. The differential amplifier 4 includes a first load 10, a second load 11, a current source 42, a differential pair circuit 13, a first switch circuit 14, a second switch circuit 15 and a third switch circuit 46. The differential amplifier 4 illustrated in FIG. 4A is similar to the differential amplifier 1 illustrated in FIG. 1A, and thus same components are denoted by the same symbols. The current source 12 of the differential amplifier 1 is replaced by the current source 42 of the differential amplifier 4, and the third switch circuit 46 is correspondingly disposed to control the current source 42. Specifically, the current source 42 includes a fifth transistor T45 and a sixth transistor T46, and these extra transistors T45 and T46 enable the differential amplifier to select a certain transistor from them for providing current to the differential pair circuit 13 and further preventing the RTN issue.

The fifth transistor T45 has a first terminal (e.g. drain terminal), a second terminal (e.g. source terminal) and a control terminal (e.g. gate terminal). The sixth transistor T46 has a first terminal (e.g. drain terminal), a second terminal (e.g. source terminal) and a control terminal (e.g. gate terminal). The first terminal of the fifth transistor T45 is coupled to the differential pair circuit 13. The second terminal of the fifth transistor T45 coupled to receive the second reference voltage Vref2. The control terminal of the fifth transistor T45 is coupled to the third switch circuit 46. The first terminal of the sixth transistor T46 is coupled to the differential pair circuit 13. The second terminal of the sixth transistor T46 coupled to receive the second reference voltage Vref2. The control terminal of the sixth transistor T46 is coupled to the third switch circuit 46. In other words, the fifth transistor T45 and the sixth transistor T46 are parallelly coupled between the differential pair circuit 13 and the second reference voltage Vref2. The switch circuit 46 determines to provide a bias voltage Vb to the fifth transistor T45 or the sixth transistor T46 according to a third control signal S3 and an inverted third control signal S3B. The inverted third control signal S3B is generated by inverting the third control signal S3 through an inverter (not illustrated in FIG. 4A).

The third switch circuit 46 includes a fifth switch 460 and a sixth switch 461. The fifth switch 460 is coupled to the control terminal of the fifth transistor T45, and the sixth switch 461 is coupled to the control terminal of the sixth transistor T46. The fifth switch 460 includes a ninth switch transistor ST41 and a tenth switch transistor ST42. The ninth switch transistor ST41 has a first terminal (e.g. drain terminal), a second terminal (e.g. source terminal) and a control terminal (e.g. gate terminal). The second transistor T12 has a first terminal (e.g. drain terminal), a second terminal (e.g. source terminal) and a control terminal (e.g. gate terminal). The first terminal of the ninth switch transistor ST41 is coupled to the control terminal of the fifth transistor T45. The second terminal of the ninth switch transistor ST41 is coupled to receive the bias voltage Vb. The control terminal of the ninth switch transistor ST41 is coupled to receive the third control signal S3. The first terminal of the tenth switch transistor ST42 is coupled to the control terminal of the fifth transistor T45. The second terminal of the tenth switch transistor ST42 is coupled to receive the second reference voltage Vref2. The control terminal of the tenth switch transistor ST42 is coupled to receive the inverted third control signal S3B. The sixth switch 461 includes an eleventh switch transistor ST43 and a twelfth switch transistor ST44. The eleventh switch transistor ST43 has a first terminal (e.g. drain terminal), a second terminal (e.g. source terminal) and a control terminal (e.g. gate terminal). The twelfth switch transistor ST44 has a first terminal (e.g. drain terminal), a second terminal (e.g. source terminal) and a control terminal (e.g. gate terminal). The first terminal of the eleventh switch transistor ST43 is coupled to the control terminal of the sixth transistor T46. The second terminal of the eleventh switch transistor ST43 is coupled to receive the bias voltage Vb. The control terminal of the eleventh switch transistor ST43 is coupled to receive the inverted third control signal S3B. The first terminal of the twelfth switch transistor ST44 is coupled to the control terminal of the sixth transistor T46. The second terminal of the twelfth switch transistor ST44 is coupled to receive the second reference voltage Vref2. The control terminal of the eleventh switch transistor ST43 is coupled to receive the third control signal S3. In brief, according to the third control signal S3, the third switch circuit 46 may selectively provide the bias voltage Vb to one of the fifth transistor T45 and the sixth transistor T46, and provide the second reference voltage Vref2 to the another one of the fifth transistor T45 and the sixth transistor T46. Therefore, the differential amplifier 4 may choose one of the fifth transistor T45 and the sixth transistor T46 according to the third control signal S3 for providing the biased current to the differential amplifier circuit 13 and prevent the RTN issue.

Figure 4B:
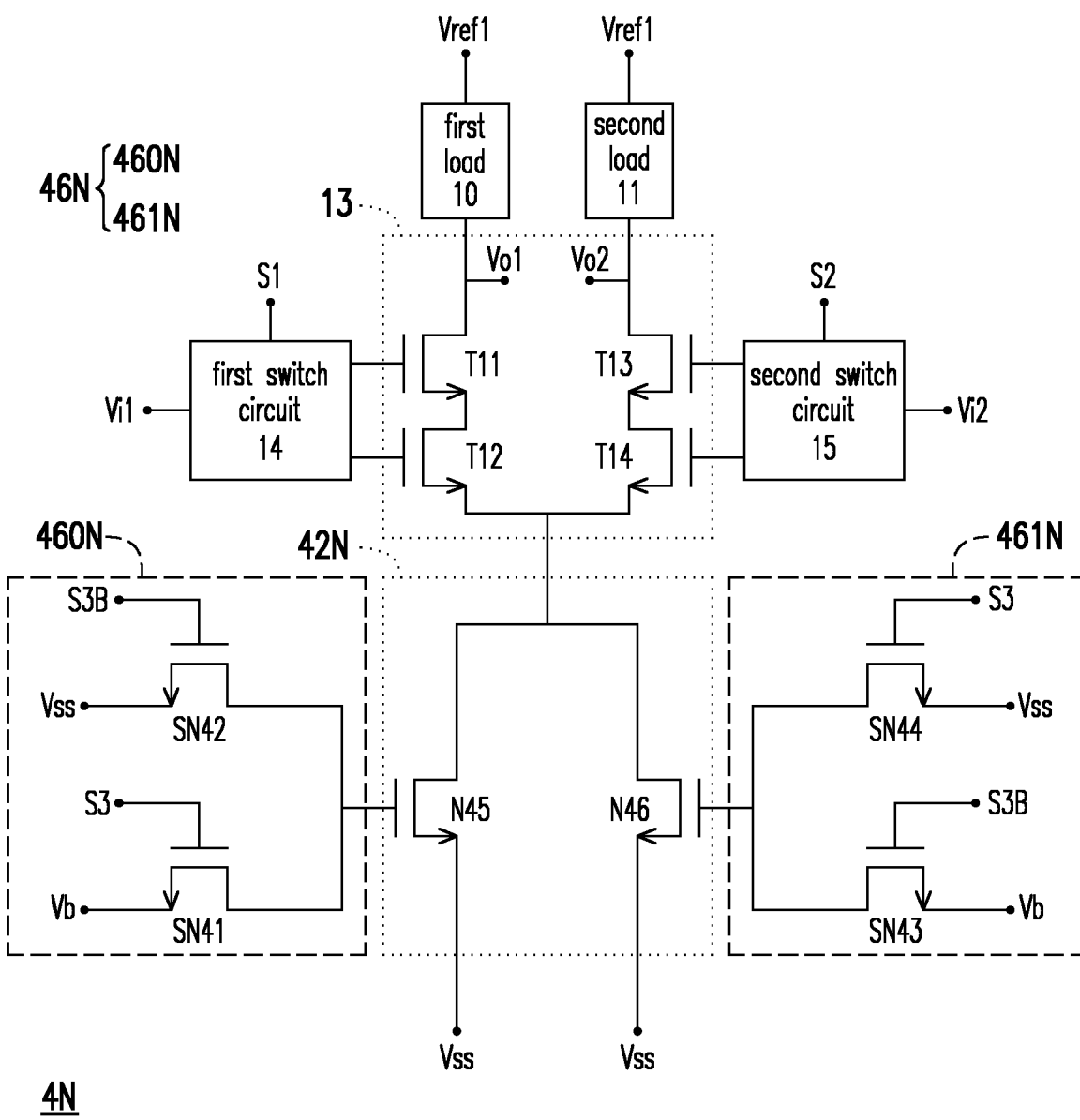
FIG. 4B is a schematic diagram of a differential amplifier in accordance with some embodiments.

Please refer to FIG. 4B, which is a schematic diagram of a differential amplifier 4N in accordance with some embodiments. The differential amplifier 4N includes a first load 10, a second load 11, a current source 42N, a differential pair circuit 13, a first switch circuit 14, a second switch circuit 15 and a third switch circuit 46N. The current source 42 includes a fifth transistor N45 and a sixth transistor N46. The third switch circuit 46N includes a fifth switch 460N and a seventh switch 461N. The fifth switch 460N includes a ninth switch transistor SN41 and a tenth switch transistor SN42, and the sixth switch 461N includes an eleventh switch transistor SN43 and a twelfth switch transistor SN44. The differential amplifier 4N illustrated in FIG. 4B is similar to the differential amplifier illustrated in FIG. 4A, except that some of the transistors in the differential amplifier 4N are N-type MOSFETs. Specifically, the fifth transistor N45, the sixth transistor N46, the ninth switch transistor SN41, the tenth switch transistor SN42, the eleventh switch transistor SN43 and the twelfth switch transistor SN44 are N-type MOSFETs. In order to supply the operation of the differential amplifier 4N, an operation voltage Vcc, which replaces the first reference voltage Vref1 illustrated in FIG. 4A, is provided to the first load 10 and the second load 11, and a ground voltage Vss, which replaces the second reference voltage Vref2 illustrated in FIG. 2A, is provided to the current source 42 and the third switch circuit 46N.

Please refer to Table VII as shown below for the operation of the fifth transistors N45 and the sixth transistor N46. The third control signal S3 corresponds to the operation of the fifth transistor N45. When the third control signal S3 with low voltage (i.e. logic 0) is provided to the third switch circuit 46N, the control terminal of the fifth transistor N45 is coupled to receive the ground voltage Vss and the control terminal of the sixth transistor N46 is coupled to receive the bias voltage Vb. Therefore, the fifth transistor N45 is operated in the cutoff region and the sixth transistor is operated in the saturation region when the third control signal S3 is low. When the third control signal S3 with high voltage (i.e. logic 1) is provided to the third switch circuit 46N, the control terminal of the fifth transistor N45 is coupled to receive the bias voltage Vb and the control terminal of the sixth transistor N46 is coupled to receive the ground voltage Vss. Therefore, the fifth transistor N45 is operated in the saturation region and the sixth transistor is operated in the cutoff region when the third control signal S3 is high.

TABLE VII

| S3 | N45 | N46 |
| --- | --- | --- |
| 0 | Cutoff | Saturation |
| 1 | Saturation | Cutoff |

Figure 4C:
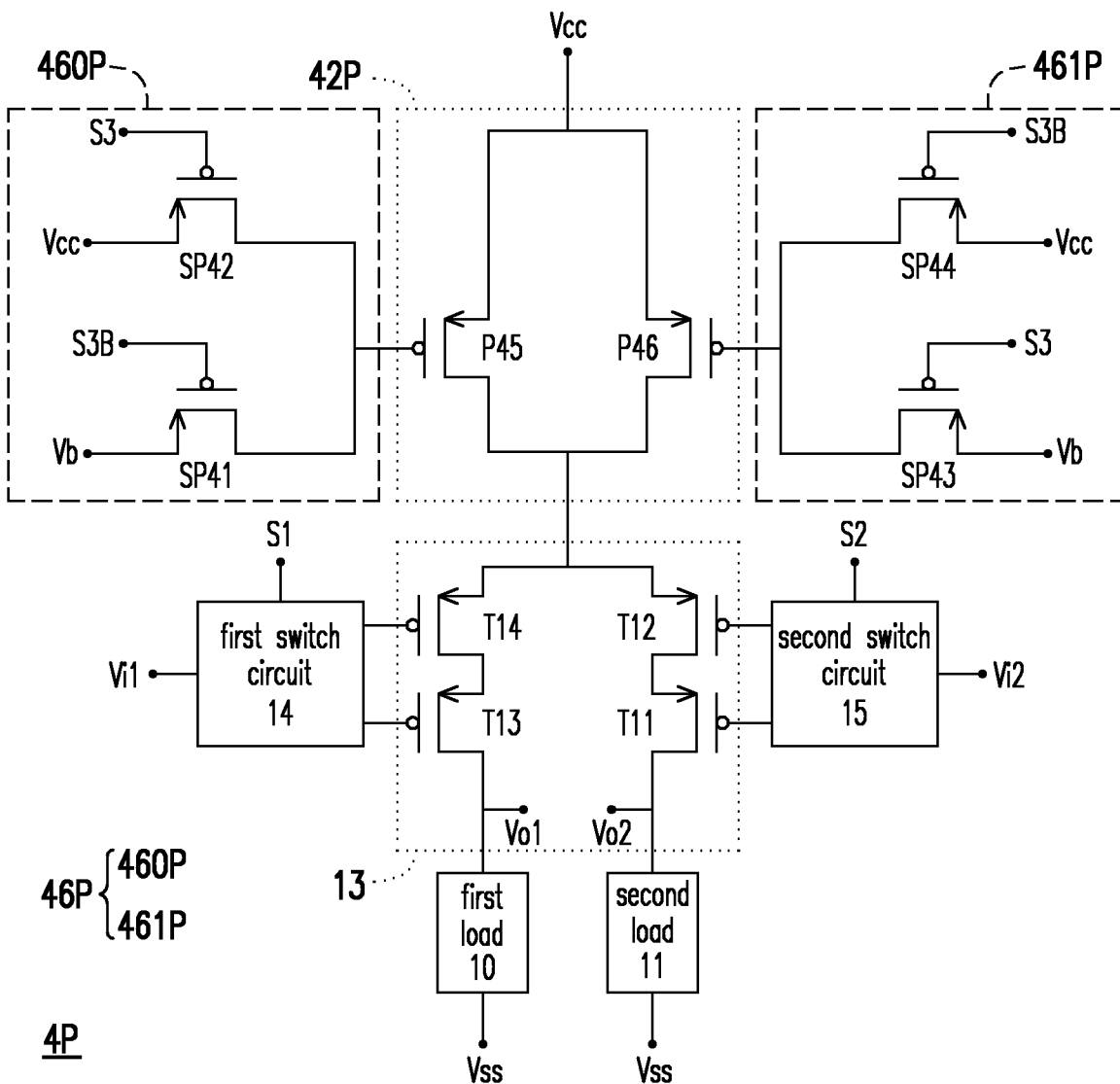
FIG. 4C is a schematic diagram of a differential amplifier in accordance with some embodiments.

Please refer to FIG. 4C, which is a schematic diagram of a differential amplifier 4P in accordance with some embodiments. The differential amplifier 4P includes a first load 10, a second load 11, a current source 42P, a differential pair circuit 13, a first switch circuit 14, a second switch circuit 15 and a third switch circuit 46P. The current source 42 includes a fifth transistor P45 and a sixth transistor P46. The third switch circuit 46P includes a fifth switch 460P and a seventh switch 461P. The fifth switch 460P includes a ninth switch transistor SP41 and a tenth switch transistor SP42, and the sixth switch 461P includes an eleventh switch transistor SP43 and a twelfth switch transistor SP44. The differential amplifier 4P illustrated in FIG. 4C is similar to the differential amplifier illustrated in FIG. 4A, except that some of the transistors in the differential amplifier 4P are P-type MOSFETs. Specifically, the fifth transistor P45, the sixth transistor P46, the ninth switch transistor SP41, the tenth switch transistor SP42, the eleventh switch transistor SP43 and the twelfth switch transistor SP44 are P-type MOSFETs. In order to supply the operation of the differential amplifier 4P, a ground voltage Vss, which replaces the first reference voltage Vref1 illustrated in FIG. 4A, is provided to the first load 10 and the second load 11, and an operation voltage Vcc, which replaces the second reference voltage Vref2 illustrated in FIG. 2A, is provided to the current source 42 and the third switch circuit 46P.

Please refer to Table VIII as shown below for the operation of the fifth transistors P45 and the sixth transistor P46. The third control signal S3 corresponds to the operation of the fifth transistor P45. When the third control signal S3 with low voltage (i.e. logic 0) is provided to the third switch circuit 46P, the control terminal of the fifth transistor P45 is coupled to receive the operation voltage Vcc and the control terminal of the sixth transistor is coupled to receive the bias voltage Vb. Therefore, the fifth transistor P45 is operated in the cutoff region and the sixth transistor P46 is operated in the saturation region when the third control signal S3 is low. When the third control signal S3 with high voltage (i.e. logic 1) is provided to the third switch circuit 46P, the control terminal of the fifth transistor P45 is coupled to receive the bias voltage Vb and the control terminal of the sixth transistor P46 is coupled to receive the operation voltage Vcc. Therefore, the fifth transistor P45 is operated in the saturation region and the sixth transistor is operated in the cutoff region when the third control signal S3 is high.

TABLE VIII

| S3 | P45 | P46 |
| --- | --- | --- |
| 0 | Cutoff | Saturation |
| 1 | Saturation | Cutoff |

Figure 5A:
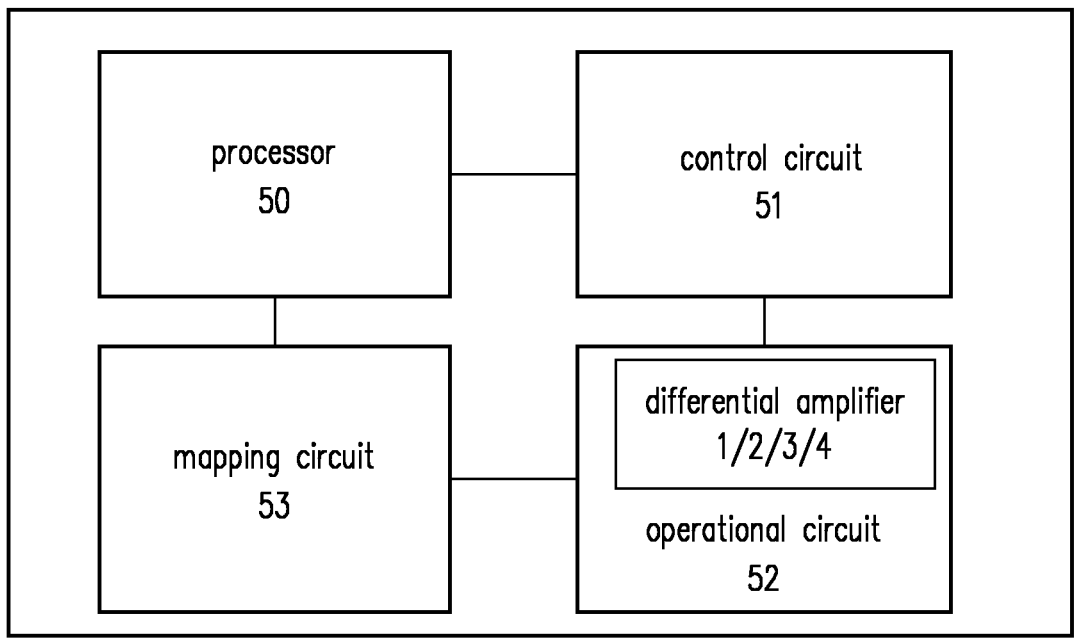
FIG. 5A is a schematic diagram of an electronic system in accordance with some embodiments.

Please refer to FIG. 5A, which is a schematic diagram of an electronic system 5 in accordance with some embodiments. The electronic system 5 includes a processor 50, a control circuit 51, an operational circuit 52 and a mapping circuit 53. Specifically, the operational circuit 52 includes the differential amplifier 1/2/3/4 mentioned in the above paragraphs. The mapping circuit 53 may detect and identify which transistor in the differential amplifier 1/2/3/4 is causing RTN issue and provide the detection result to the processor 50. The processor 50 may receive detection result from the mapping circuit 53 and accordingly instruct the control circuit 51 to generate the corresponding control signals. Therefore, the electronic system 5 can identify whether there is any transistor causing RTN in the operational circuit 52 using the mapping circuit 53. The processor 50 may instruct the control circuit 51 to generate the corresponding control signals to select proper transistors in the differential amplifier 1/2/3/4 for signal processing. As a result, the electronic system 5 can effectively avoid using the transistors which would cause RTN for signal processing to further improve the signal integrity.

Figure 5B:
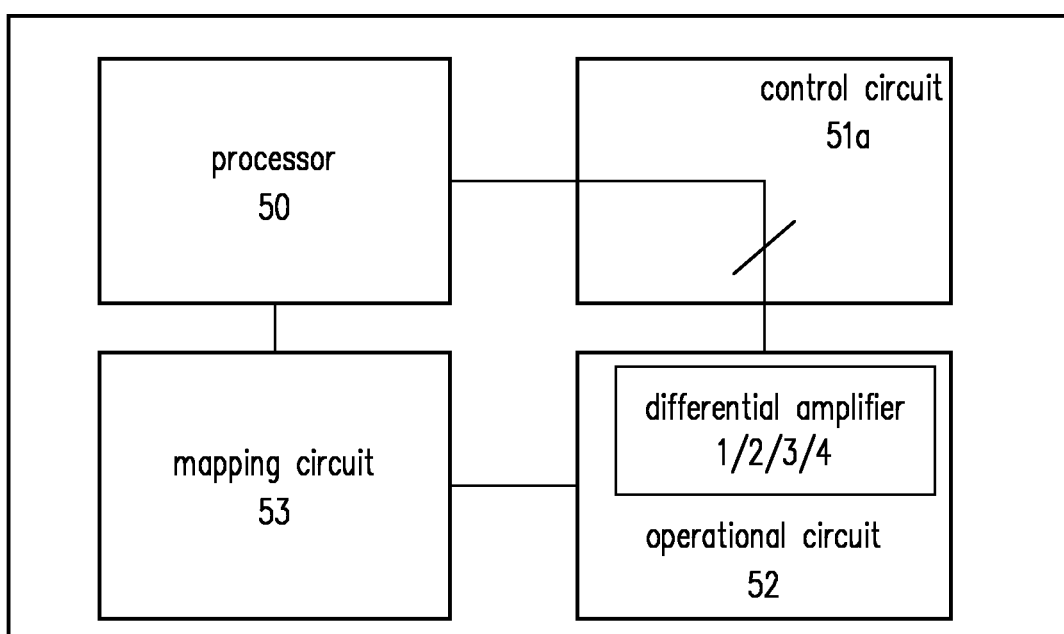
FIG. 5B is a schematic diagram of an electronic system in accordance with some embodiments.

Please refer to FIG. 5B, which is a schematic diagram of an electronic system 5a in accordance with some embodiments. The electronic system 5a includes a processor 50, a control circuit 51a, an operational circuit 52 and a mapping circuit 53. The electronic system 5a illustrated in FIG. 5B is similar to the electronic system 5 illustrated in FIG. 5A, except that the control circuit 51 in the electronic system 5 is replaced by the control circuit 51a in the electronic system 5a. In this embodiment, the control circuit 51a may include one to one mapping circuit, and the control signals is generated by the processor 50 and delivered to the differential amplifier 1/2/3/4 of the operational circuit 52. For example, the control circuit 51a may include signal buffers or level shifters to deliver the control signals to the differential amplifier 1/2/3/4.

Figure 5C:
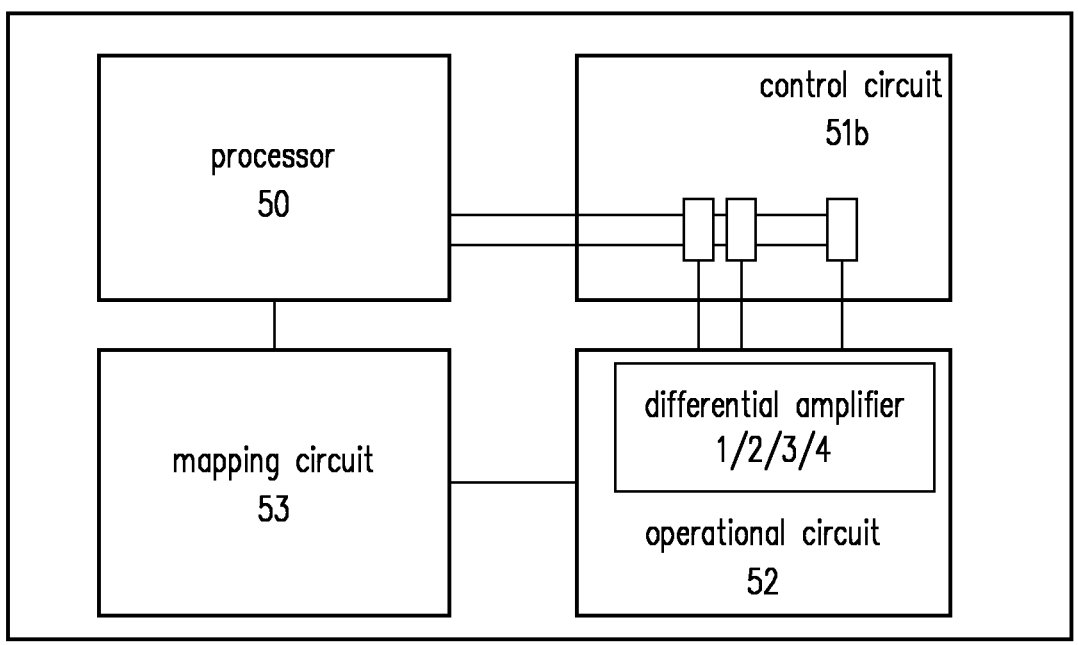
FIG. 5C is a schematic diagram of an electronic system in accordance with some embodiments.

Please refer to FIG. 5C, which is a schematic diagram of an electronic system 5b in accordance with some embodiments. The electronic system 5b includes a processor 50, a control circuit 51b, an operational circuit 52 and a mapping circuit 53. The electronic system 5b illustrated in FIG. 5C is similar to the electronic system 5 illustrated in FIG. 5A, except that the control circuit 51 in the electronic system 5 is replaced by the control circuit 51b in the electronic system 5b. In this embodiment, the control circuit 51 includes shift registers, and the control signals is received by the shift register and delivered to the differential amplifier 1/2/3/4 in a synchronized manner.

In summary, redundant or backup semiconductor components are disposed in the differential amplifier and the electronic system, so it takes only one scan by the differential amplifier before initiation or power on to detect and identify which component inside is defect or attributed to the noise, and the differential amplifier and the electronic system may use better components for signal processing to further prevent noise issue. Therefore, the consumed power and data latency of the differential amplifier and the electronic device is reduced through operation in the foreground.

In an embodiment, differential amplifier, includes a first load and a second load;
 a current source; a differential pair circuit connected to the first load, the second load and the current source, wherein the differential pair circuit includes a first transistor having a first terminal coupled to the first load, a second terminal and a control terminal; a second transistor, having a first terminal coupled to the second terminal of the first transistor, a second terminal coupled to the current source and a control terminal; a third transistor having a first terminal coupled to the second load, a second terminal and a control terminal; and a fourth transistor, having a first terminal coupled to the second terminal of the third transistor, a second terminal coupled to the current source and a control terminal; a first switch circuit, coupled to the control terminal of the first transistor and the control terminal of the second transistor, wherein the first switch circuit provides a first input signal to the first transistor or the second transistor according to a first control signal; and a second switch circuit, coupled to the control terminal of the third transistor and the control terminal of the fourth transistor, wherein the second switch circuit provides a second input signal to the third transistor or the fourth transistor according to a second control signal. In an embodiment, when the first switch circuit provides the first input signal to the control terminal of one of the first transistor and the second transistor, the first switch circuit provides a first reference voltage to the control terminal of another one of the first transistor and the second transistor, and wherein when the second switch circuit provides the second input signal to the control terminal of one of the third transistor and the fourth transistor, the second switch circuit provides the first reference voltage to the control terminal of another one of the third transistor and the fourth transistor. In an embodiment, the first switch circuit includes a first switch coupled to the control terminal of the first transistor and a second switch coupled to the control terminal of the second transistor, and when the first switch provides one of the first input signal and the first reference voltage to the control terminal of the first transistor, the second switch provides another one of the first input signal and the first reference voltage to the control terminal of the second transistor, and the second switch circuit includes a third switch coupled to the control terminal of the third transistor and a fourth switch coupled to the control terminal of the fourth transistor, and when the third switch provides one of the second input signal and the first reference voltage to the control terminal of the third transistor, the fourth switch provides another one of the second input signal and the first reference voltage to the control terminal of the fourth transistor. In an embodiment, the first switch includes a first switch transistor and a second switch transistor, the first switch transistor has a first terminal coupled to the first transistor, a second terminal receiving the first input signal and a control terminal receiving the first control signal, and the second switch transistor has a first terminal coupled to the first transistor, a second terminal receiving the first reference voltage and a control terminal receiving the inverted first control signal, the second switch includes a third switch transistor and a fourth switch transistor, the third switch transistor has a first terminal coupled to the second transistor, a second terminal receiving the first reference voltage and a control terminal receiving the first control signal, and the fourth switch transistor has a first terminal coupled to the second transistor, a second terminal receiving the first input signal and a control terminal receiving the inverted first control signal, the third switch includes a fifth switch transistor and a sixth switch transistor, the fifth switch transistor has a first terminal coupled to the third transistor, a second terminal receiving the second input signal and a control terminal receiving the second control signal, and the sixth switch transistor has a first terminal coupled to the third transistor, a second terminal receiving the first reference voltage and a control terminal receiving the inverted second control signal, and the fourth switch includes a seventh switch transistor and an eighth switch transistor, the seventh switch transistor has a first terminal coupled to the fourth transistor, a second terminal receiving the first reference voltage and a control terminal receiving the second control signal, and the eighth switch transistor has a first terminal coupled to the fourth transistor, a second terminal receiving the second input signal and a control terminal receiving the inverted second control signal. In an embodiment, the first reference voltage is an operating voltage, the second reference voltage is a ground voltage, and the first transistor, the second transistor, the third transistor, and the fourth transistor are N-type MOSFETs. In an embodiment, the first reference voltage is a ground voltage, the second reference voltage is an operating voltage, and the first transistor, the second transistor, the third transistor, and the fourth transistor are P-type MOSFETs. In an embodiment, the current source includes a fifth transistor and a sixth transistor, the fifth transistor has a first terminal connected to the differential pair circuit, a second terminal receiving a second reference voltage and a control terminal, the sixth transistor has a first terminal connected to the differential pair circuit, a second terminal receiving the second reference voltage and a control terminal, and the differential amplifier includes a third switch circuit coupled to the control terminal of the fifth transistor and the control terminal of the sixth transistor, the third switch circuit provides a bias voltage to one of the fifth transistor and the sixth transistor and provides a second reference voltage to another one of the fifth transistor and the sixth transistor according to a third control signal. In an embodiment, the current source includes a fifth transistor and a sixth transistor, the fifth transistor has a first terminal connected to the differential pair circuit, a second terminal and a control terminal, the sixth transistor has a first terminal connected to the second terminal of the fifth transistor, a second terminal receiving the second reference voltage and a control terminal, and the differential amplifier includes a third switch circuit coupled to the control terminal of the fifth transistor and the control terminal of the sixth transistor, the third switch circuit provides a bias voltage to one of the fifth transistor and the sixth transistor and provides a first reference voltage to another one of the fifth transistor and the sixth transistor according to a third control signal.

In an embodiment, a differential amplifier, includes a first load and a second load both connected to a first reference voltage; a current source connected to a second reference voltage; a differential pair circuit connected to the first load, the second load and the current source, wherein the differential pair circuit includes a first transistor having a first terminal coupled to the first load, a second terminal coupled to the current source and a control terminal; a second transistor a first terminal coupled to the first load, a second terminal coupled to the current source and a control terminal; a third transistor having a first terminal coupled to the second load, a second terminal coupled to the current source and a control terminal; and a fourth transistor having a first terminal coupled to the second load, a second terminal coupled to the current source and a control terminal; a first switch circuit, coupled to the control terminals of the first transistor and the second transistor, wherein the first switch circuit provides a first input signal to the first transistor or the second transistor according to a first control signal; and a second switch circuit, coupled to the control terminals of the third transistor and the fourth transistor, wherein the second switch circuit provides a second input signal to the third transistor or the fourth transistor according to a second control signal. In an embodiment, when the first switch circuit provides the first input signal to the control terminal of one of the first transistor and the second transistor, the first switch circuit provides the second reference voltage to the control terminal of another one of the first transistor and the second transistor, and when the second switch circuit provides the second input signal to the control terminal of one of the third transistor and the fourth transistor, the second switch circuit provides the second reference voltage to the control terminal of another one of the third transistor and the fourth transistor. In an embodiment, the first switch circuit includes a first switch coupled to the control terminal of the first transistor and a second switch coupled to the control terminal of the second transistor, and when the first switch provides one of the first input signal and the second reference voltage to the control terminal of the first transistor, the second switch provides another one of the first input signal and the second reference voltage to the control terminal of the second transistor, and wherein the second switch circuit includes a third switch coupled to the control terminal of the third transistor and a fourth switch coupled to the control terminal of the fourth transistor, and when the third switch provides one of the second input signal and the second reference voltage to the control terminal of the third transistor, the fourth switch provide another one of the second input signal and the second reference voltage to the control terminal of the fourth transistor. In an embodiment, the first switch includes a first switch transistor and a second switch transistor, the first switch transistor has a first terminal coupled to the control terminal of the first transistor, a second terminal receiving the first input signal and a control terminal receiving the first control signal, and the second switch transistor has a first terminal coupled to the control terminal of the first transistor, a second terminal receiving the second reference voltage and a control terminal receiving an inverted first control signal, the second switch includes a third switch transistor and a fourth switch transistor, the third switch transistor has a first terminal coupled to the control terminal of the second transistor, a second terminal receiving the second reference voltage and a control terminal receiving the first control signal, and the fourth switch transistor has a first terminal coupled to the control terminal of the second transistor, a second terminal receiving the first input signal and a control terminal receiving the inverted first control signal, the third switch includes a fifth switch transistor and a sixth switch transistor, the fifth switch transistor has a first terminal coupled to the control terminal of the third transistor, a second terminal receiving the second input signal and a control terminal receiving the second control signal, and the sixth switch transistor has a first terminal coupled to the control terminal of the third transistor, a second terminal receiving the second reference voltage and a control terminal receiving the inverted second control signal, and the fourth switch includes a seventh switch transistor and an eighth switch transistor, the seventh switch transistor has a first terminal coupled to the control terminal of the fourth transistor, a second terminal receiving the second reference voltage and a control terminal receiving the second control signal, and the eighth switch transistor has a first terminal coupled to the control terminal of the fourth transistor, a second terminal receiving the second input signal and a control terminal receiving the inverted second control signal. In an embodiment, the current source includes a fifth transistor and a sixth transistor, the fifth transistor has a first terminal connected to the differential pair circuit, a second terminal receiving the second reference voltage and a control terminal, the sixth transistor has a first terminal connected to the differential pair circuit, a second terminal receiving the second reference voltage and a control terminal, and wherein the differential amplifier includes a third switch circuit coupled to the control terminal of the fifth transistor and the control terminal of the sixth transistor, the third switch circuit provides a bias voltage to one of the fifth transistor and the sixth transistor and provides a second reference voltage to another one of the fifth transistor and the sixth transistor according to a third control signal. In an embodiment, the current source includes a fifth transistor and a sixth transistor, the fifth transistor has a first terminal connected to the differential pair circuit, a second terminal and a control terminal, the sixth transistor has a first terminal connected to the second terminal of the fifth transistor, a second terminal receiving the second reference voltage and a control terminal, and wherein the differential amplifier includes a third switch circuit coupled to the control terminal of the fifth transistor and the control terminal of the sixth transistor, the third switch circuit provides a bias voltage to one of the fifth transistor and the sixth transistor and provides a first reference voltage to another one of the fifth transistor and the sixth transistor according to a third control signal.

In an embodiment, a differential amplifier, includes a first load and a second load both connected to a first reference voltage; a current source connected to a second reference voltage; a differential pair circuit connected to the first load, the second load and the current source, wherein the differential pair circuit includes a first transistor having a first terminal coupled to the first load, a second terminal coupled to the current source and a control terminal receiving a first input signal; a second transistor a first terminal coupled to the first load, a second terminal coupled to the current source and a control terminal receiving the first input signal; a third transistor having a first terminal coupled to the second load, a second terminal coupled to the current source and a control terminal receiving a second input signal; and a fourth transistor having a first terminal coupled to the second load, a second terminal coupled to the current source and a control terminal receiving the second input signal; a first switch circuit, coupled to the first terminal of the first transistor, the first terminal of the second transistor and the first load, wherein the first switch circuit connects the first load to the first terminal of the first transistor or the first terminal of the second transistor according to a first control signal; and a second switch circuit, coupled to the first terminal of the third transistor, the first terminal of the fourth transistor and the second load, wherein the second switch circuit connects the second load to the first terminal of third transistor or the first terminal of fourth transistor according to a second control signal. In an embodiment, when the first switch circuit connects the first load to one of the first terminal of the first transistor and the first terminal of the second transistor, the first switch circuit provides the second reference voltage to another one of the first terminal of the first transistor and the first terminal of the second transistor, and when the second switch circuit connects the second load to one of the first terminal of the third transistor and the first terminal of the fourth transistor, the second switch circuit provides the second reference voltage to another one of the first terminal of the third transistor and the first terminal of the fourth transistor. In an embodiment, the first switch circuit includes a first switch coupled between the first load and the first terminal of the first transistor and a second switch coupled between the first load and the first terminal of the second transistor, and when the first switch provides a connection from one of the first load and the second reference voltage to the first terminal of the first transistor, the second switch provides a connection from another one of the first load and the second reference voltage to the first terminal of the second transistor, wherein the second switch circuit includes a third switch coupled between the second load and the first terminal of the third transistor and a fourth switch coupled between the second load and the first terminal of the fourth transistor, and when the third switch provides a connection from one of the second load and the second reference voltage to the first terminal of the third transistor, the fourth switch provides a connection from another one of the second load and the second reference voltage to the first terminal of the fourth transistor. In an embodiment, the first switch includes a first switch transistor and a second switch transistor, the first switch transistor has a first terminal coupled to the first load, a second terminal coupled to the first terminal of the first transistor and a control terminal receiving the first control signal, and the second switch transistor has a first terminal coupled to the first terminal of the first transistor, a second terminal receiving the second reference voltage and a control terminal receiving an inverted first control signal, the second switch includes a third switch transistor and a fourth switch transistor, the third switch transistor has a first terminal coupled to the first load, a second terminal coupled to the first terminal of the second transistor and a control terminal receiving the inverted first control signal, and the fourth switch transistor has a first terminal coupled to the first terminal of the second transistor, a second terminal receiving the second reference voltage and a control terminal receiving the first control signal, the third switch includes a fifth switch transistor and a sixth switch transistor, the fifth switch transistor has a first terminal coupled to the second load, a second terminal coupled to the first terminal of the third transistor and a control terminal receiving the second control signal, and the sixth switch transistor has a first terminal coupled to the first terminal of the third transistor, a second terminal receiving the second reference voltage and a control terminal receiving an inverted second control signal, and the fourth switch includes a seventh switch transistor and an eighth switch transistor, the seventh switch transistor has a first terminal coupled to the second load, a second terminal coupled to the first terminal of the fourth transistor and a control terminal receiving the inverted second control sig-
nal, and the eighth switch transistor has a first terminal coupled to the first terminal of the fourth transistor, a second terminal receiving the second reference voltage and a control terminal receiving the second control signal. In an embodiment, the current source includes a fifth transistor and a sixth transistor, the fifth transistor has a first terminal connected to the differential pair circuit, a second terminal receiving the second reference voltage and a control terminal, the sixth transistor has a first terminal connected to the differential pair circuit, a second terminal receiving the second reference voltage and a control terminal, and the differential amplifier includes a third switch circuit coupled to the control terminal of the fifth transistor and the control terminal of the sixth transistor, the third switch circuit provides a bias voltage to one of the fifth transistor and the sixth transistor and provides a second reference voltage to another one of the fifth transistor and the sixth transistor according to a third control signal. In an embodiment, the current source includes a fifth transistor and a sixth transistor, the fifth transistor has a first terminal connected to the differential pair circuit, a second terminal and a control terminal, the sixth transistor has a first terminal connected to the second terminal of the fifth transistor, a second terminal receiving the second reference voltage and a control terminal, and wherein the differential amplifier includes a third switch circuit coupled to the control terminal of the fifth transistor and the control terminal of the sixth transistor, the third switch circuit provides a bias voltage to one of the fifth transistor and the sixth transistor and provides a first reference voltage to another one of the fifth transistor and the sixth transistor according to a third control signal.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A differential amplifier, comprising:
   a first load and a second load both connected to a first reference voltage;
   a current source connected to a second reference voltage;
   a differential pair circuit connected to the first load, the second load and the current source, wherein the differential pair circuit comprises:
   a first transistor having a first terminal coupled to the first load, a second terminal coupled to the current source and a control terminal;
   a second transistor having a first terminal coupled to the first load, a second terminal coupled to the current source and a control terminal;
   a third transistor having a first terminal coupled to the second load, a second terminal coupled to the current source and a control terminal; and
   a fourth transistor having a first terminal coupled to the second load, a second terminal coupled to the current source and a control terminal;
   a first switch circuit, coupled to the first transistor and the second transistor, wherein the first switch circuit is configured to select one of the first and second transistors according to a first control signal, and the selected one of the first and second transistors is enabled and provided with a first input signal for amplification; and a second switch circuit, coupled to the third transistor and the fourth transistor, wherein the second switch circuit is configured to select one of the third and fourth transistors according to a second control signal, and the selected one of the third and fourth transistors is enabled and provided with a second input signal for amplification, wherein the first control signal and the second control signal are configured to disable at least one of the transistors that causes a random telegraph noise.

2. The differential amplifier of claim 1, wherein when the first switch circuit provides the first input signal to the control terminal of one of the first transistor and the second transistor, the first switch circuit provides the second reference voltage to the control terminal of another one of the first transistor and the second transistor, and wherein when the second switch circuit provides the second input signal to the control terminal of one of the third transistor and the fourth transistor, the second switch circuit provides the second reference voltage to the control terminal of another one of the third transistor and the fourth transistor.

3. The differential amplifier of claim 1, wherein the first switch circuit comprises a first switch coupled to the control terminal of the first transistor and a second switch coupled to the control terminal of the second transistor, and when the first switch provides one of the first input signal and the second reference voltage to the control terminal of the first transistor, the second switch provides another one of the first input signal and the second reference voltage to the control terminal of the second transistor, and wherein the second switch circuit comprises a third switch coupled to the control terminal of the third transistor and a fourth switch coupled to the control terminal of the fourth transistor, and when the third switch provides one of the second input signal and the second reference voltage to the control terminal of the third transistor, the fourth switch provide another one of the second input signal and the second reference voltage to the control terminal of the fourth transistor.

4. The differential amplifier of claim 3, wherein the first switch comprises a first switch transistor and a second switch transistor, the first switch transistor has a first terminal coupled to the control terminal of the first transistor, a second terminal receiving the first input signal and a control terminal receiving the first control signal, and the second switch transistor has a first terminal coupled to the control terminal of the first transistor, a second terminal receiving the second reference voltage and a control terminal receiving an inverted first control signal, the second switch comprises a third switch transistor and a fourth switch transistor, the third switch transistor has a first terminal coupled to the control terminal of the second transistor, a second terminal receiving the second reference voltage and a control terminal receiving the first control signal, and the fourth switch transistor has a first terminal coupled to the control terminal of the second transistor, a second terminal receiving the first input signal and a control terminal receiving the inverted first control signal, the third switch comprises a fifth switch transistor and a sixth switch transistor, the fifth switch transistor has a first terminal coupled to the control terminal of the third transistor, a second terminal receiving the second input signal and a control terminal receiving the second control signal, and the sixth switch transistor has a first terminal coupled to the control terminal of the third transistor, a second terminal receiving the second reference voltage and a control terminal receiving an inverted second control signal, and the fourth switch comprises a seventh switch transistor and an eighth switch transistor, the seventh switch transistor has a first terminal coupled to the control terminal of the fourth transistor, a second terminal receiving the second reference voltage and a control terminal receiving the second control signal, and the eighth switch transistor has a first terminal coupled to the control terminal of the fourth transistor, a second terminal receiving the second input signal and a control terminal receiving the inverted second control signal.

5. The differential amplifier of claim 1, wherein the current source comprises a fifth transistor and a sixth transistor, the fifth transistor has a first terminal connected to the differential pair circuit, a second terminal receiving the second reference voltage and a control terminal, the sixth transistor has a first terminal connected to the differential pair circuit, a second terminal receiving the second reference voltage and a control terminal, and wherein the differential amplifier comprises a third switch circuit coupled to the control terminal of the fifth transistor and the control terminal of the sixth transistor, the third switch circuit provides a bias voltage to one of the fifth transistor and the sixth transistor and provides a second reference voltage to another one of the fifth transistor and the sixth transistor according to a third control signal.

6. The differential amplifier of claim 1, wherein the current source comprises a fifth transistor and a sixth transistor, the fifth transistor has a first terminal connected to the differential pair circuit, a second terminal and a control terminal, the sixth transistor has a first terminal connected to the second terminal of the fifth transistor, a second terminal receiving the second reference voltage and a control terminal, and wherein the differential amplifier comprises a third switch circuit coupled to the control terminal of the fifth transistor and the control terminal of the sixth transistor, the third switch circuit provides a bias voltage to one of the fifth transistor and the sixth transistor and provides a first reference voltage to another one of the fifth transistor and the sixth transistor according to a third control signal.

7. A differential amplifier, comprising:
a first load and a second load both connected to a first reference voltage;
a current source connected to a second reference voltage;
a differential pair circuit connected to the first load, the second load and the current source, wherein the differential pair circuit comprises:
a first transistor having a first terminal coupled to the first load, a second terminal coupled to the current source and a control terminal receiving a first input signal;
a second transistor having a first terminal coupled to the first load, a second terminal coupled to the current source and a control terminal receiving the first input signal;

a third transistor having a first terminal coupled to the second load, a second terminal coupled to the current source and a control terminal receiving a second input signal; and a fourth transistor having a first terminal coupled to the second load, a second terminal coupled to the current source and a control terminal receiving the second input signal;

a first switch circuit, coupled to the first transistor and the second transistor, wherein the first switch circuit is configured to select one of the first and second transistors according to a first control signal, and the selected one of the first and second transistors is enabled and coupled to the first load for amplification; and a second switch circuit, coupled to the third transistor and the fourth transistor, wherein the second switch circuit is configured to select one of the third and fourth transistors according to a second control signal, and the selected one of the third and fourth transistors is enabled and coupled to the second load for amplification, wherein the first control signal and the second control signal are configured to disable at least one of the transistors that causes a random telegraph noise.

8. The differential amplifier of claim 7, wherein when the first switch circuit connects the first load to one of the first terminal of the first transistor and the first terminal of the second transistor, the first switch circuit provides the second reference voltage to another one of the first terminal of the first transistor and the first terminal of the second transistor, and wherein when the second switch circuit connects the second load to one of the first terminal of the third transistor and the first terminal of the fourth transistor, the second switch circuit provides the second reference voltage to another one of the first terminal of the third transistor and the first terminal of the fourth transistor.

9. The differential amplifier of claim 8, wherein the first switch circuit comprises a first switch coupled between the first load and the first terminal of the first transistor and a second switch coupled between the first load and the first terminal of the second transistor, and when the first switch provides a connection from one of the first load and the second reference voltage to the first terminal of the first transistor, the second switch provides a connection from another one of the first load and the second reference voltage to the first terminal of the second transistor, wherein the second switch circuit comprises a third switch coupled between the second load and the first terminal of the third transistor and a fourth switch coupled between the second load and the first terminal of the fourth transistor, and when the third switch provides a connection from one of the second load and the second reference voltage to the first terminal of the third transistor, the fourth switch provides a connection from another one of the second load and the second reference voltage to the first terminal of the fourth transistor.

10. The differential amplifier of claim 9, wherein the first switch comprises a first switch transistor and a second switch transistor, the first switch transistor has a first terminal coupled to the first load, a second terminal coupled to the first terminal of the first transistor and a control terminal receiving the first control signal, and the second switch transistor has a first terminal coupled to the first terminal of the first transistor, a second terminal receiving the second reference voltage and a control terminal receiving an inverted first control signal, wherein the second switch comprises a third switch transistor and a fourth switch transistor, the third switch transistor has a first terminal coupled to the first load, a second terminal coupled to the first terminal of the second transistor and a control terminal receiving the inverted first control signal, and the fourth switch transistor has a first terminal coupled to the first terminal of the second transistor, a second terminal receiving the second reference voltage and a control terminal receiving the first control signal, wherein the third switch comprises a fifth switch transistor and a sixth switch transistor, the fifth switch transistor has a first terminal coupled to the second load, a second terminal coupled to the first terminal of the third transistor and a control terminal receiving the second control signal, and the sixth switch transistor has a first terminal coupled to the first terminal of the third transistor, a second terminal receiving the second reference voltage and a control terminal receiving an inverted second control signal, and wherein the fourth switch comprises a seventh switch transistor and an eighth switch transistor, the seventh switch transistor has a first terminal coupled to the second load, a second terminal coupled to the first terminal of the fourth transistor and a control terminal receiving the inverted second control signal, and the eighth switch transistor has a first terminal coupled to the first terminal of the fourth transistor, a second terminal receiving the second reference voltage and a control terminal receiving the second control signal.

11. The differential amplifier of claim 7, wherein the current source comprises a fifth transistor and a sixth transistor, the fifth transistor has a first terminal connected to the differential pair circuit, a second terminal receiving the second reference voltage and a control terminal, the sixth transistor has a first terminal connected to the differential pair circuit, a second terminal receiving the second reference voltage and a control terminal, and wherein the differential amplifier comprises a third switch circuit coupled to the control terminal of the fifth transistor and the control terminal of the sixth transistor, the third switch circuit provides a bias voltage to one of the fifth transistor and the sixth transistor and provides a second reference voltage to another one of the fifth transistor and the sixth transistor according to a third control signal.

12. The differential amplifier of claim 7, wherein the current source comprises a fifth transistor and a sixth transistor, the fifth transistor has a first terminal connected to the differential pair circuit, a second terminal and a control terminal, the sixth transistor has a first terminal connected to the second terminal of the fifth transistor, a second terminal receiving the second reference voltage and a control terminal, and wherein the differential amplifier comprises a third switch circuit coupled to the control terminal of the fifth transistor and the control terminal of the sixth transistor, the third switch circuit provides a bias voltage to one of the fifth transistor and the sixth transistor and provides a first reference voltage to another one of the fifth transistor and the sixth transistor according to a third control signal.

13. A differential amplifier, comprising:
a first load and a second load both connected to a first reference voltage;
a differential pair circuit connected to the first load, the second load and a current source, wherein the differential pair circuit comprises:
  a first transistor having a first terminal coupled to the first load, a second terminal coupled to the current source and a control terminal;
  a second transistor having a first terminal coupled to the first load, a second terminal coupled to the current source and a control terminal;
  a third transistor having a first terminal coupled to the second load, a second terminal coupled to the current source and a control terminal; and
  a fourth transistor having a first terminal coupled to the second load, a second terminal coupled to the current source and a control terminal;
a first switch circuit, coupled to the first transistor and the second transistor, wherein the first switch circuit is configured to select one of the first and second transistors according to a first control signal, and the selected one of the first and second transistors is enabled for amplification; and
a second switch circuit, coupled to the third transistor and the fourth transistor, wherein the second switch circuit is configured to select one of the third and fourth transistors according to a second control signal, and the selected one of the third and fourth transistors is enabled for amplification,
wherein the first control signal and the second control signal are configured to disable at least one of the transistors that causes a random telegraph noise.

14. The differential amplifier of claim 13, wherein when the first switch circuit provides a first input signal to the control terminal of one of the first transistor and the second transistor, the first switch circuit provides a first reference voltage to the control terminal of another one of the first transistor and the second transistor, and
wherein when the second switch circuit provides a second input signal to the control terminal of one of the third transistor and the fourth transistor, the second switch circuit provides the first reference voltage to the control terminal of another one of the third transistor and the fourth transistor.

15. The differential amplifier of claim 14, wherein the first switch circuit comprises
a first switch coupled to the control terminal of the first transistor and a second switch coupled to the control terminal of the second transistor, and when the first switch provides one of the first input signal and the first reference voltage to the control terminal of the first transistor, the second switch provides another one of the first input signal and the first reference voltage to the control terminal of the second transistor, and
wherein the second switch circuit comprises a third switch coupled to the control terminal of the third transistor and a fourth switch coupled to the control terminal of the fourth transistor, and when the third switch provides one of the second input signal and the first reference voltage to the control terminal of the third transistor, the fourth switch provides another one of the second input signal and the first reference voltage to the control terminal of the fourth transistor.

16. The differential amplifier of claim 15, wherein the first switch comprises a first switch transistor and a second switch transistor, the first switch transistor has a first terminal coupled to the first transistor, a second terminal receiving the first input signal and a control terminal receiving the first control signal, and the second switch transistor has a first terminal coupled to the first transistor, a second terminal receiving the first reference voltage and a control terminal receiving the inverted first control signal,
the second switch comprises a third switch transistor and a fourth switch transistor, the third switch transistor has a first terminal coupled to the second transistor, a second terminal receiving the first reference voltage and a control terminal receiving the first control signal, and the fourth switch transistor has a first terminal coupled to the second transistor, a second terminal receiving the first input signal and a control terminal receiving the inverted first control signal,
the third switch comprises a fifth switch transistor and a sixth switch transistor, the fifth switch transistor has a first terminal coupled to the third transistor, a second terminal receiving the second input signal and a control terminal receiving the second control signal, and the sixth switch transistor has a first terminal coupled to the third transistor, a second terminal receiving the first reference voltage and a control terminal receiving an inverted second control signal, and
the fourth switch comprises a seventh switch transistor and an eighth switch transistor, the seventh switch transistor has a first terminal coupled to the fourth transistor, a second terminal receiving the first reference voltage and a control terminal receiving the second control signal, and the eighth switch transistor has a first terminal coupled to the fourth transistor, a second terminal receiving the second input signal and a control terminal receiving the inverted second control signal.

17. The differential amplifier of claim 16, wherein the first reference voltage is an operating voltage, the current source is connected to a second reference voltage, the second reference voltage is a ground voltage, and the first transistor the second transistor, the third transistor, and the fourth transistor are N-type MOSFETs.

18. The differential amplifier of claim 16, wherein the first reference voltage is a ground voltage, a second reference voltage connected to the current source is an operating voltage, and the first transistor the second transistor, the third transistor, and the fourth transistor are P-type MOSFETs.

19. The differential amplifier of claim 13, wherein the current source comprises a fifth transistor and a sixth transistor, the fifth transistor has a first terminal connected to the differential pair circuit, a second terminal receiving a second reference voltage and a control terminal, the sixth transistor has a first terminal connected to the differential pair circuit, a second terminal receiving the second reference voltage and a control terminal, and
wherein the differential amplifier comprises a third switch circuit coupled to the control terminal of the fifth transistor and the control terminal of the sixth transistor, the third switch circuit provides a bias voltage to one of the fifth transistor and the sixth transistor and provides a second reference voltage to another one of the fifth transistor and the sixth transistor according to a third control signal.

20. The differential amplifier of claim 13, wherein the current source comprises a fifth transistor and a sixth transistor, the fifth transistor has a first terminal connected to the differential pair circuit, a second terminal and a control terminal, the sixth transistor has a first terminal connected to the second terminal of the fifth transistor, a second terminal receiving a second reference voltage and a control terminal, and wherein the differential amplifier comprises a third switch circuit coupled to the control terminal of the fifth transistor and the control terminal of the sixth transistor, the third switch circuit provides a bias voltage to one of the fifth transistor and the sixth transistor and provides a first reference voltage to another one of the fifth transistor and the sixth transistor according to a third control signal.

* * * * *